US009426929B2

(12) United States Patent
Laidig et al.

(10) Patent No.: US 9,426,929 B2
(45) Date of Patent: *Aug. 23, 2016

(54) LEADFRAME PACKAGE WITH INTEGRATED PARTIAL WAVEGUIDE INTERFACE

(71) Applicant: ViaSat, Inc., Carlsbad, CA (US)

(72) Inventors: David R. Laidig, Mesa, AZ (US); Kenneth V. Buer, Gilbert, AZ (US); Michael R. Lyons, Gilbert, AZ (US); Noel A. Lopez, Chandler, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/793,422

(22) Filed: Jul. 7, 2015

(65) Prior Publication Data

US 2016/0050793 A1 Feb. 18, 2016

Related U.S. Application Data

(63) Continuation of application No. 14/088,077, filed on Nov. 22, 2013, now Pat. No. 9,142,492, which is a continuation of application No. 13/221,693, filed on Aug. 30, 2011, now Pat. No. 8,592,960.

(60) Provisional application No. 61/378,889, filed on Aug. 31, 2010.

(51) Int. Cl.
*H01L 23/04* (2006.01)
*H05K 7/20* (2006.01)
(Continued)

(52) U.S. Cl.
CPC .......... *H05K 7/20409* (2013.01); *H01L 23/047* (2013.01); *H01L 23/315* (2013.01);
(Continued)

(58) Field of Classification Search
CPC ................ H01L 2924/00; H01L 2224/48247; H01L 2924/00014; H01L 2224/48091
See application file for complete search history.

(56) References Cited

U.S. PATENT DOCUMENTS

| 5,057,805 A | 10/1991 | Kadowaki |
| 5,526,525 A | 6/1996 | Minowa et al. |

(Continued)

FOREIGN PATENT DOCUMENTS

| AU | 2011218651 B2 | 1/2015 |
| EP | 0624004 A1 | 11/1994 |

(Continued)

OTHER PUBLICATIONS

International Search Report and Written Opinion mailed in International (PCT) Application No. PCT/US2009/033681 on Aug. 27, 2009, 6 pgs.

(Continued)

*Primary Examiner* — Jaehwan Oh
(74) *Attorney, Agent, or Firm* — Snell & Wilmer L.L.P.

(57) ABSTRACT

A MMIC package is disclosed comprising: a leadframe based overmolded package, a die positioned within the overmolded package; and a partial waveguide interface, wherein the partial waveguide interface is integral with the overmolded package facilitating low cost and reliable assembly. Also disclosed is an overmolded package where the die sits on a metal portion exposed on the bottom of the package and the package is configured for attachment to a chassis of a transceiver such that heat from the die is easily dissipated to the chassis with a direct thermal path. The disclosure facilitates parallel assembly of MMIC packages and use of pick and place/surface mounting technology for attaching the MMIC packages to the chassis of transceivers. This facilitates reliable and low cost transceivers.

20 Claims, 30 Drawing Sheets

(51) Int. Cl.
*H01L 23/047* (2006.01)
*H01L 23/66* (2006.01)
*H01Q 23/00* (2006.01)
*H01L 23/495* (2006.01)
*H01L 23/31* (2006.01)
*H05K 7/02* (2006.01)

(52) U.S. Cl.
CPC ........ *H01L23/495* (2013.01); *H01L 23/49541* (2013.01); *H01L 23/49568* (2013.01); *H01L 23/66* (2013.01); *H01Q 23/00* (2013.01); *H05K 7/02* (2013.01); *H01L 2223/6627* (2013.01); *H01L 2223/6683* (2013.01); *H01L 2224/48091* (2013.01)

(56) References Cited

U.S. PATENT DOCUMENTS

| | | | |
|---|---|---|---|
| 5,530,285 A | 6/1996 | Brenndoerfer | |
| 5,541,565 A | 7/1996 | Dowsing, III et al. | |
| 5,557,144 A | 9/1996 | Rosenstock et al. | |
| 5,663,597 A | 9/1997 | Nelson et al. | |
| 6,078,101 A | 6/2000 | Aizenberg et al. | |
| 6,133,795 A | 10/2000 | Williams | |
| 6,160,454 A | 12/2000 | Buer et al. | |
| 6,208,214 B1 | 3/2001 | Geddes et al. | |
| 6,275,684 B1 | 8/2001 | Kaneko et al. | |
| 6,317,003 B1 | 11/2001 | Kobayashi | |
| 6,442,374 B1 | 8/2002 | Brady et al. | |
| 6,462,628 B2 | 10/2002 | Kondo et al. | |
| 6,483,186 B1 * | 11/2002 | Hsieh | H01L 23/3121 257/705 |
| 6,508,550 B1 * | 1/2003 | Eastlund | B41J 11/002 219/693 |
| 6,535,546 B1 | 3/2003 | Bethscheider et al. | |
| 6,542,035 B2 | 4/2003 | Cook et al. | |
| 6,570,442 B2 | 5/2003 | Nakai et al. | |
| 6,597,925 B1 | 7/2003 | Garcia et al. | |
| 6,788,171 B2 | 9/2004 | Ammar et al. | |
| 6,809,688 B2 | 10/2004 | Yamada | |
| 6,917,256 B2 * | 7/2005 | Emrick | H01P 5/107 333/248 |
| 7,035,617 B2 * | 4/2006 | Buer | H04B 1/26 331/96 |
| 7,050,765 B2 | 5/2006 | Ammar et al. | |
| 8,072,065 B2 | 12/2011 | Lopez et al. | |
| 8,592,960 B2 | 11/2013 | Laidig et al. | |
| 8,872,333 B2 | 10/2014 | Lopez et al. | |
| 9,142,492 B2 | 9/2015 | Laidig et al. | |
| 2002/0075105 A1 * | 6/2002 | Douriet | H01L 23/66 333/247 |
| 2002/0102959 A1 * | 8/2002 | Buer | H04B 1/26 455/326 |
| 2003/0169134 A1 | 9/2003 | Ammar et al. | |
| 2004/0036550 A1 * | 2/2004 | Emrick | H01P 5/107 333/26 |
| 2008/0157344 A1 | 7/2008 | Chen et al. | |
| 2009/0051018 A1 * | 2/2009 | Moline | H01L 21/568 257/675 |
| 2010/0038776 A1 * | 2/2010 | Bessemoulin | H01L 21/568 257/728 |
| 2012/0051000 A1 * | 3/2012 | Laidig | H01L 23/047 361/736 |
| 2014/0183710 A1 | 7/2014 | Laidig et al. | |

FOREIGN PATENT DOCUMENTS

| | | |
|---|---|---|
| EP | 1227578 A2 | 7/2002 |
| EP | 2248398 B1 | 5/2014 |
| GB | 2483966 B | 11/2014 |
| KR | 102003003201 | 4/2003 |
| KR | 102004001057 | 1/2004 |
| TW | 561599 | 11/2003 |
| WO | WO-02/49103 A2 | 6/2002 |
| WO | WO-03/079565 A1 | 9/2003 |
| WO | WO-2006/001389 A1 | 1/2006 |
| WO | WO-2009/102721 A2 | 8/2009 |

OTHER PUBLICATIONS

International Preliminary Report on Patentability mailed in International (PCT) Application No. PCT/US2009/033681 on Aug. 17, 2010, 4 pgs.

Office Action and Search Report mailed in Taiwanese Patent Application No. 98104448 on Mar. 17, 2015, 8 pgs.

\* cited by examiner

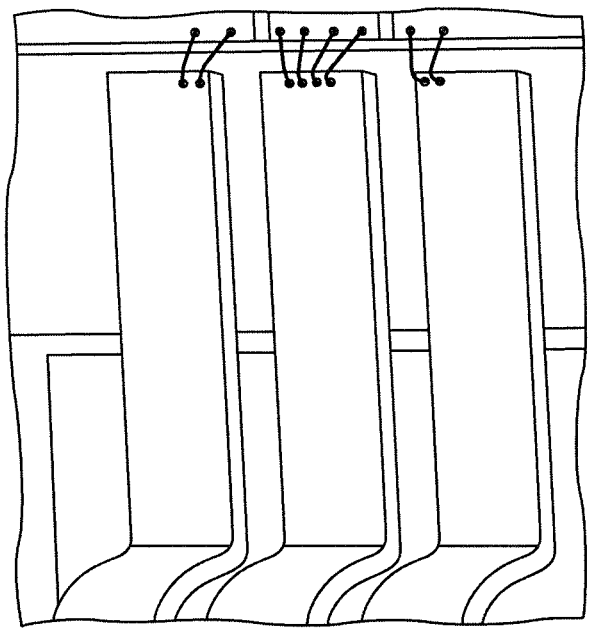
FIG.12C STRAIGHT
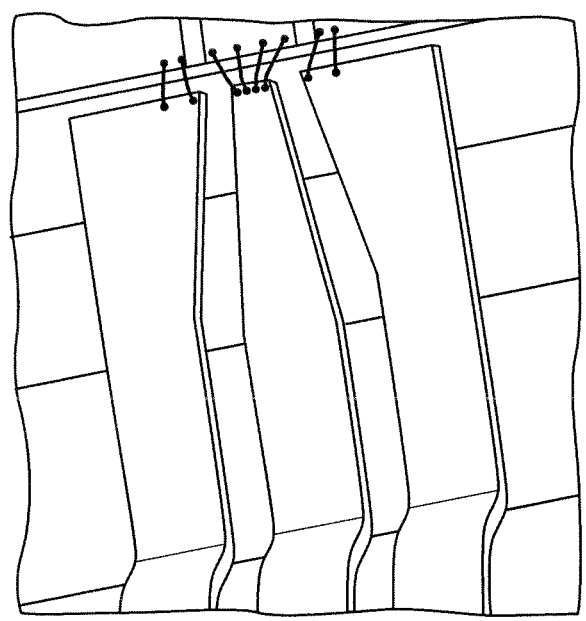
FIG.12B TAPERED

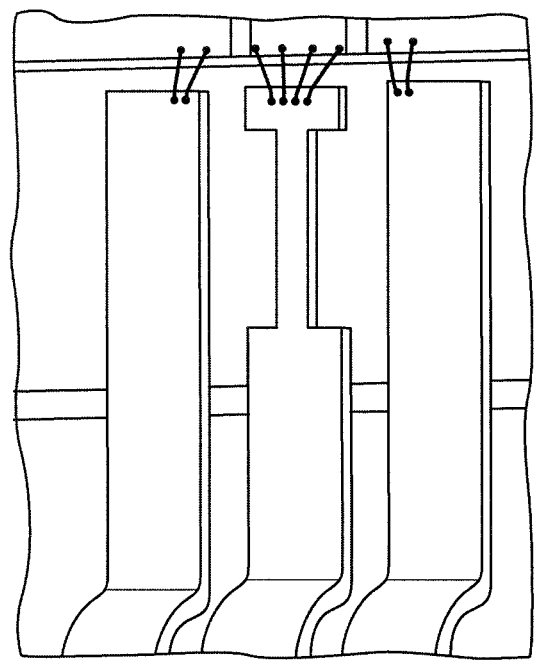
FIG.12D NECK-UP
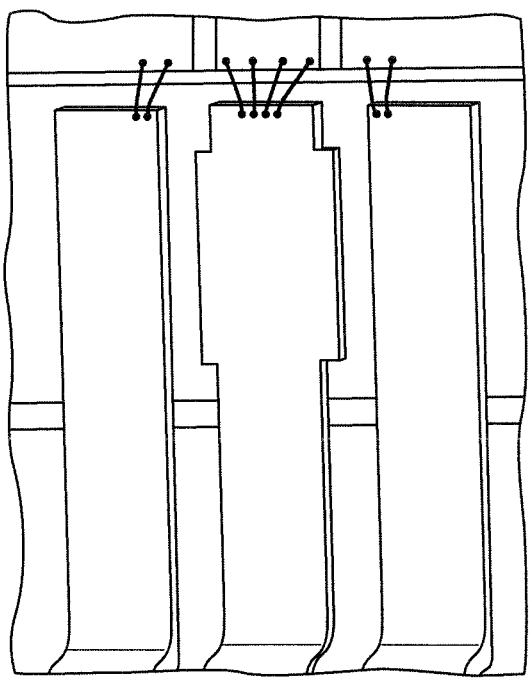
FIG.12E NECK-DOWN

LEADFRAME PACKAGE WITH INTEGRATED PARTIAL WAVEGUIDE INTERFACE

CROSS-REFERENCE TO RELATED APPLICATIONS

This application is a continuation of U.S. Non-Provisional application Ser. No. 14/088,077, entitled "LEADFRAME PACKAGE WITH INTEGRATED PARTIAL WAVEGUIDE INTERFACE," which was filed on Nov. 22, 2013. The '077 application is a continuation of U.S. Non-Provisional application Ser. No. 13/221,693, entitled "LEADFRAME PACKAGE WITH INTEGRATED PARTIAL WAVEGUIDE INTERFACE," which was filed on Aug. 30, 2011 and issued as U.S. Pat. No. 8,592,960 on Nov. 26, 2013. The '960 patent claims priority to U.S. Provisional Application No. 61/378,889, entitled "OVER-MOLDED LEADFRAME PACKAGE," which was filed on Aug. 31, 2010. All of the aforementioned applications are hereby incorporated by reference.

FIELD

The subject of this disclosure may relate generally to systems, devices, and methods for mounting and packaging mm-wave MMIC devices.

BACKGROUND

Typically a MMIC is connected to a printed wiring board ("PWB"), and the printed wiring board is connected to a chassis. A stripline on the PWB may convey an RF signal from the MMIC to a waveguide and the signal may then be launched into the waveguide. This prior art example involves relatively expensive assembly procedures. The present disclosure describes lower cost methods and highly reliable devices for making millimeter wave packages that facilitate simpler assembly of higher level systems.

SUMMARY

In one example embodiment, a RF MMIC package is disclosed that comprises: a package body portion comprising a MMIC disposed within the package body portion; a partial waveguide interface; an overmold material forming portions of both the package body portion and the partial waveguide interface so as to cause the partial waveguide interface to be an integral part of the package body portion; and a leadframe, wherein the leadframe is electrically connected to the MMIC, and wherein the leadframe forms part of both the package body portion and the waveguide interface.

In another example embodiment, a method of forming a mm-wave MMIC package is disclosed comprising the steps of: forming a leadframe comprising leads, wherein the leads include DC leads, RF leads, a waveguide transition, and an RF launch; overmolding at least a portion of the waveguide transition and portions of the leadframe, wherein the overmolding creates a package base that is integrated with a partial waveguide interface, wherein the partial waveguide interface protrudes from the package base, wherein the integrated partial waveguide interface comprises the waveguide transition and the RF launch; and attaching and electrically connecting a MMIC to the leadframe within the package base.

In yet another example embodiment, a MMIC package is disclosed comprising: a leadframe based overmolded package, a die positioned within the overmolded package; and a partial waveguide interface, wherein the partial waveguide interface is integral with the overmolded package.

In another example, a transceiver housing is disclosed that comprises: a metal chassis having a waveguide; a PWB attached to the metal chassis; a package comprising a MMIC and a metal portion on a first surface of the package, the MMIC in direct thermal contact with the metal portion; the package electrically connected to the PWB, and wherein the metal portion of the package is attached directly to the metal chassis providing a direct heat sink path from the MMIC to the metal chassis; wherein the package comprises a portion of an waveguide interface that is integrated in the package, wherein the package is located so as to align a probe portion of the waveguide interface with the waveguide in the metal chassis; and a cover separately connected to the metal chassis, wherein the cover is one of a metal cover or a metalized plastic cover, and wherein the cover forms a waveguide backshort for the waveguide.

BRIEF DESCRIPTION OF THE DRAWINGS

These and other features, aspects and advantages of the present invention will become better understood with reference to the following description, appending claims, and accompanying drawings where:

FIG. 12A-12F illustrate various structures for tuning associated with the leadframe;

DETAILED DESCRIPTION

In accordance with various embodiments of the present invention, systems, devices, and methods are provided, for among other things, manufacturing a monolithic microwave integrated circuit ("MMIC") package and/or mounting the MMIC package in higher level assemblies. The following descriptions are not intended as a limitation on the use or applicability of the invention, but instead, are provided merely to enable a full and complete description of various embodiments.

In accordance with various example embodiments of the present invention, a new MMIC package and method of manufacturing the MMIC package is disclosed. As described in greater detail, in various embodiments, the MMIC package comprises a MMIC in an overmolded leadframe package. In various embodiments, the MMIC is completely enclosed in the package (hermetically sealed lid or complete overmolding). In other example embodiments, the MMIC package further comprises an integrated partial waveguide interface. For example, a microstrip and launch (i.e., a portion of the waveguide interface) may be formed as part of the MMIC package. In various embodiments, the remaining portion(s) of the waveguide interface are provided when assembling the next higher assembly level.

Moreover, the leads from the package leadframe are configured, in various embodiments, to alleviate tolerance issues in the next higher assembly level. In addition, the leads are configured to provide mechanical stress relief between the host printed circuit board ("PCB") and the package, but also to electrically maintain a matched RF impedance on the leads used for RF interconnect. Additionally, in various embodiments, special structures associated with the leads are disclosed, which facilitate tuning the lead interface.

Also disclosed are various methods and structures for connecting the MMIC package to the next higher assembly level. For example, the MMIC package may be configured to be in direct thermal contact with a metal chassis of the next higher assembly level. In this manner, the MMIC package does not have a printed wiring board ("PWB") interfering with the thermal pathway between the MMIC in the MMIC package and a heat sink (in the chassis). Various example covers are also disclosed for completing the waveguide interface when assembled in conjunction with the package.

Figure 1:
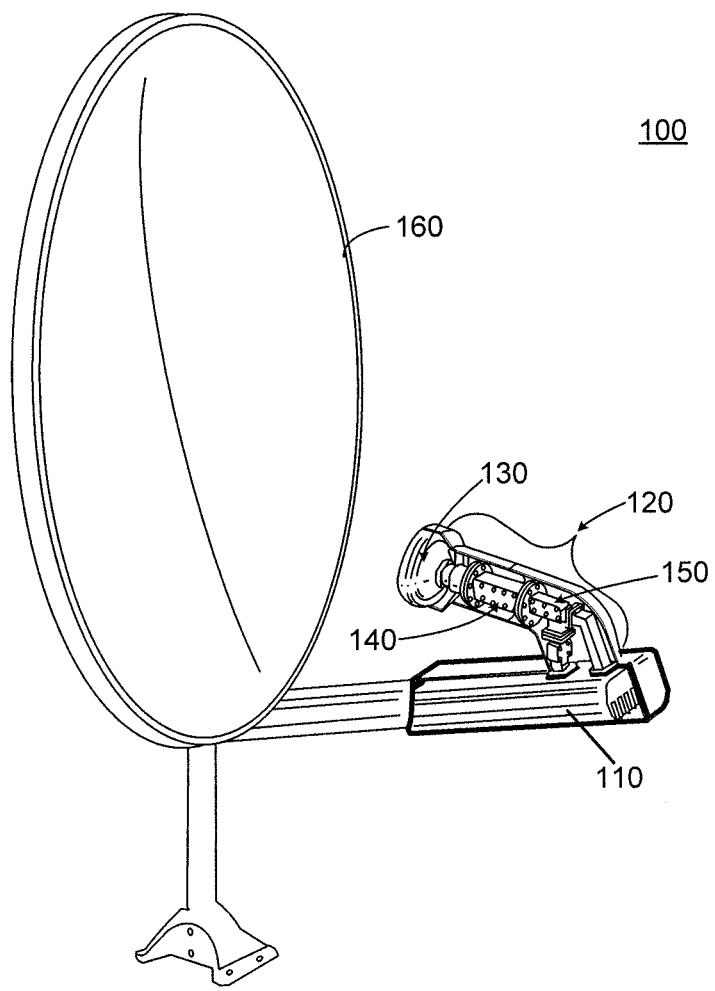
FIG. 1 illustrates, for context, a perspective view of an example satellite transceiver system in accordance with various embodiments of the invention.

With reference now to FIG. 1, although the disclosure herein may be suitable to various technologies, various embodiments will be discussed herein in the context of an example satellite radio frequency ("RF") transceiver system. In this context, RF transceiver system 100 may comprise a transceiver 110, an antenna feed system 120, and a dish 160. An antenna feed system 120 may comprise, for example, a feed horn 130, a polarizer 140, and an ortho-mode transducer ("OMT") 150. RF transceiver system 100 may be configured, for example, to communicate RF signals between a modem and a satellite. It should be understood that various components and configurations may be used in any RF transceiver system, and that this example system 100 merely illustrates one system in which the MMIC package and other disclosure herein may be used.

Transceiver 110 may comprise one or more MMIC packages. Example MMIC packages and methods of manufacturing such packages will be described in further detail beginning with reference to FIG. 2A. In accordance with various example embodiments, a MMIC package may comprise a leadframe based overmolded package ("overmolded package"), and a die. The die may be positioned within the overmolded package. The MMIC package may further comprise an integrated partial waveguide interface. The MMIC package may comprise any suitable shape and configuration of components, but several example embodiments and methods for forming such embodiments are described herein.

Figure 2A:
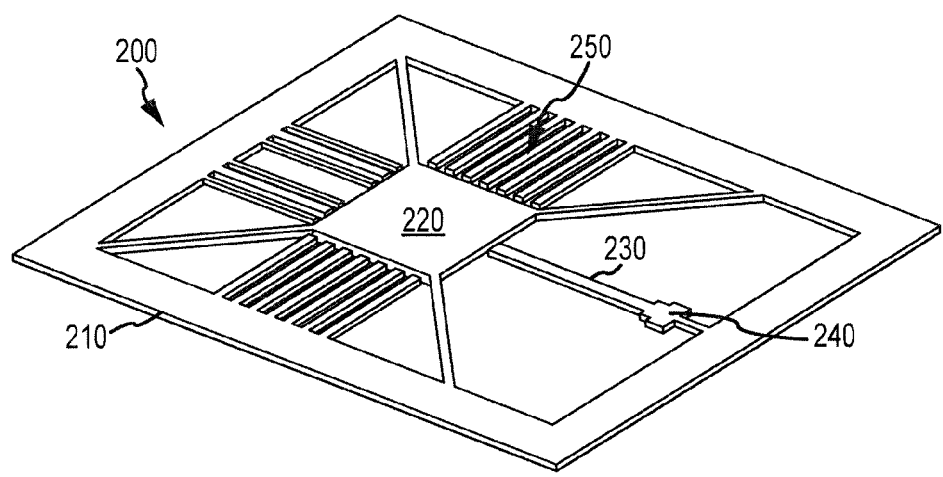
FIGS. 2A-2B illustrate an example leadframe at various steps in the manufacturing process in accordance with a first example embodiment.

In one example embodiment, and with reference now to FIG. 2A, an example leadframe 200 is illustrated. Leadframe 200 may comprise a frame 210, a pad 220, a strip-line 230, a launch 240, and various leads 250. Leadframe 200 may be formed, for example, by etching or stamping to form a desired pattern for leadframe 200. In various embodiments, lead frame 200 is formed in strip form. In another example embodiment, leadframe 200 is formed in an array. For example, a 1×4 array of leadframes could be formed. Moreover, any size and number of components may form an n×m array of leadframes. The array may further comprise features on some of the edges of the array to facilitate holding the part in the manufacturing equipment. Furthermore, any suitable method of forming leadframe 200 may be used.

Leadframe 200 may comprise any suitable conducting material. For example, leadframe 200 may comprise copper, copper alloy, suitable metal, or any other suitable conducting material. In various embodiments, leadframe 200 is nickel plated with wire-bondable gold plating. The material may be configured to conduct electricity well. For example, the material may be configured to have a conductivity greater than $10^7$ S/m. However any suitable conductivity may be used. In addition, the material may be configured to conduct RF signals at desired frequencies. For example, the material may be configured to have smooth surfaces and edges (preferably controlled within 10 um or better. The material may further comprise low non-linear ferromagnetic properties (such as with a permeability less than $10^{-3}$ H/m). However, any suitable configurations may be used. Also, the material may be configured to conduct heat well. For example, the material may have a thermal conductivity greater than 200 W/m-K. However, any suitable thermal conductivity may be used. Furthermore, in various embodiments, leadframe 200 may comprise multiple materials, metal alloys, different platings and/or materials selected to have optimal combinations of these properties. As a non-limiting example, BeCu may be used in one example leadframe.

Figure 2B:
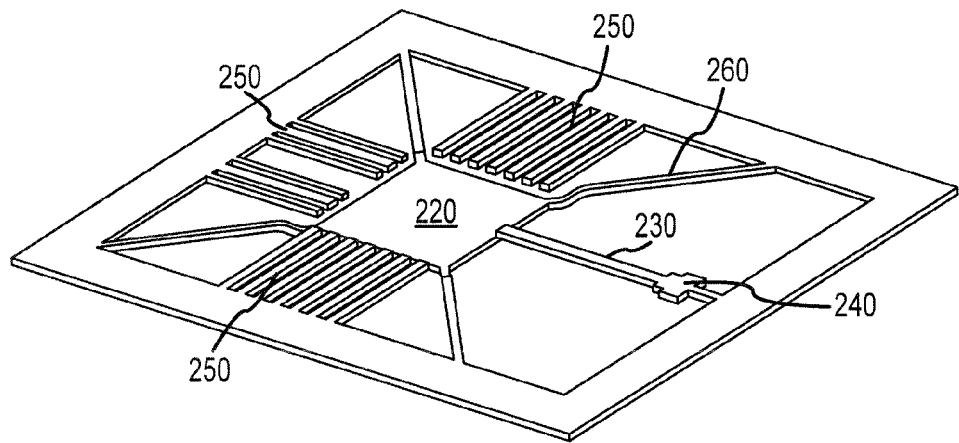

Leadframe 200, in various embodiments is flat, or undeformed (see for example, FIG. 2A). In one example embodiment, the thickness of leadframe 200 is from 0.002 to 0.100 inches. However any suitable leadframe thickness may be used. In various embodiments, leadframe 200 is further processed through cutting, and or deforming various portions of the leadframe. For example, with reference to FIG. 2B, leads 250 and strip-line 230 are severed from pad 220. In addition, pad 220 is offset from the plane of frame 210. I.e., pad 220 is positioned to be "deep downset." Support elements 260 connect/support frame 210 to pad 220. These support elements 260 are deformed to cause pad 220 to be in a different plane than other portions of the leadframe, such as leads 250, frame 210, and/or strip line 230. Furthermore, any technique for facilitating deep downset of pad 220 may be used. The deep downset configuration, in various embodiments allows the pad 220, also known as the "die paddle," to be flush with the package bottom as will be described further herein.

The cutting of portions of the leadframe may be performed using any suitable technique. In one example embodiment, a laser is used to cut the leads and/or strip-line. In other example embodiments, stamping or chemical etching are used to remove material from portions of the leadframe. Furthermore, any suitable technique may be used to remove portions of the leadframe. Moreover, the deforming of portions of the leadframe may be performed using any suitable technique. In one example embodiment, stamping may be used to deform support elements 260. Furthermore, any suitable deformation techniques may be used.

Figure 3:
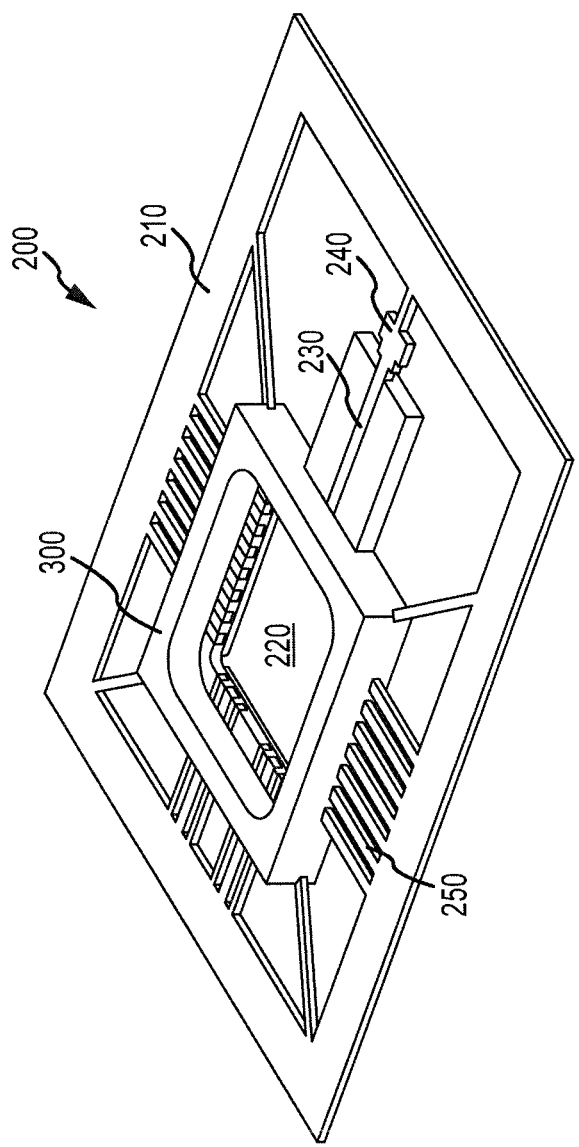
FIG. 3 illustrates an example deep downset leadframe after transfer molding in accordance with a first example embodiment.

With reference now to FIG. 3, in various embodiments, leadframe structure 200 is overmolded. This process may be called Transfer Molding or Overmolding. For example, an overmold material 300 may be injected around portions of leadframe 200. In various embodiments, the overmolding is accomplished using injection molding. In another example embodiment, the overmolding is done in strip form (i.e., in a batch or in an array format). In further example embodiments, the overmold may be provided using casting techniques. Furthermore, the overmold may be formed using any suitable process for molding plastic. Furthermore, the overmold process may comprise any suitable technique for forming a material around portions of leadframe 200.

Material 300 may be formed around portions of the leadframe in such a way as to hold and/or support leads 250, pad 220, and/or strip-line 230 in a set position. For example, material 300 may be formed around portions of leadframe 200 so as to hold pad 220 in deep downset configuration relative to other portions of leadframe 200 such as leads 250 and/or strip-line 230.

In various embodiments, overmold material 300 is configured to form a structure suitable for containing an electronic device. In one example embodiment, the electronic device is a MMIC. In one example embodiment, the overmold material forms an overmolded "body structure" or "a package base." In another example embodiment, overmold material 300 forms sides of a box like structure with pad 220 forming the bottom of the box. The box or body structure (also described herein as a "package base") is configured to receive, an electronic device. For example, the body structure or box may be configured to receive a MMIC. The overmold material 300 may be shaped to form any suitable structure configured to contain a MMIC and or the like device. Thus, in one example embodiment, overmold material 300 forms at least part of a cavity for receiving a MMIC. For sake of clarity, the overmold material does not necessarily have to form a box with sides, but could be any suitable structure for holding portions of leadframe 200 and an electronic device (e.g., MMIC).

Overmold material 300 is only formed around a portion of leadframe 200. For example, launch 240 may be left with no overmold material 300 surrounding or touching the launch. In another example embodiment, microstrip 230 is supported, but not covered by overmold material 300. As an aside, it is noted that the term "microstrip" is used throughout this specification, however, it should be understood that many suitable methods may be used for communicating RF signal including coaxial and other waveguide transition devices. Thus, wherever the term "microstrip" is used herein, it should be understood to mean any similar device for conveying the signal. In yet another example embodiment, pad 220 is exposed on both sides and is generally not covered be overmold material 300 except possibly near the edges of pad 220. However, in various embodiments, overmold material 300 may be over, under, and/or around portions of leadframe 200. In other words, the MMIC package ultimately formed may comprise a leadframe at least partially enclosed in an overmold material.

Furthermore, portions of leads 250 may be exposed both inside the overmold structure and outside the overmold structure. In this manner, leads 250 may protrude from overmold material 300 and/or a portion of leads 250 may be exposed inside the overmold structure to form bond pads. These bond pads may facilitate wire bonding to the electronic device to be received in the package.

It is noted that the thickness of overmold walls of the sides of the box or body structure may be the same on all sides, or may be made of different thickness as desired. In one example embodiment, the thickness is thicker on the DC input sides and thinner than that on the RF input/output sides. In various embodiments, the dielectric material may be minimized near the RF interconnections. This may facilitate a reduction in loss in the signals communicated through the RF interconnections.

In accordance with various embodiments, overmold material 300 may comprise an injection molded plastic, a ceramic material, a polymer, and/or any dielectric moldable material. In various embodiments, the polymer may comprise a liquid crystal polymer (LCP).

Although described herein most commonly with the polymer being a LCP, in other example embodiments cheaper more common die overmolding polymers may be used. This is particularly the case for applications where higher interface losses can be tolerated. Thus, in other example embodiments, the polymer comprises one of the following polymers: LCP, Polyphenylene Sulfide (PPS), Polyether ether ketone (PEEK), any thermoplastic polymer, and any thermoset polymer. Thus, overmold material may comprise any suitable material for casting, injection molding, or otherwise overmolding leadframe 200 as described herein. Furthermore, suitable materials may comprise low dielectric constant and/or low loss tangent materials.

Figure 4A:
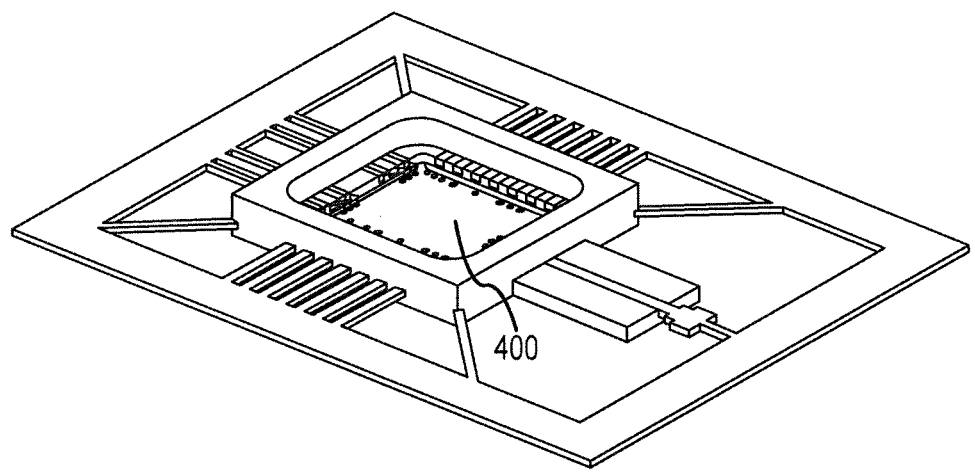
FIGS. 4A-4B respectively illustrate an example package after adding an example die and after adding an example lid in accordance with a first example embodiment.

In accordance with various embodiments, and with reference now to FIG. 4A, an electronic device is added to the package. In one example embodiment, the electronic device is a die. In another example embodiment, the die is a MMIC. In accordance with various embodiments, the MMIC comprises one of the following: a high power amplifier, and a block up converter ("BUC"). Furthermore, in various embodiments, the MMIC comprises a high power, high frequency device. For example, high power, high frequency devices may comprise devices operating at frequencies greater than 10 GHz and at power levels greater than 1 W. In another example, high frequencies may be frequencies of 8 GHz or higher and high power may be greater than 5 watts, greater than 8 watts, or greater than 10 watts. However, any suitable power and frequency levels and combinations thereof may be suitable.

MMIC 400 may be placed in physical contact with pad 220. In various embodiments, placement of MMIC 400 in contact with pad 220 facilitates heat transfer from MMIC 400 to pad 220. In this example embodiment, there is no object between MMIC 400 and pad 220 that would interfere with the heat transfer. In various embodiments, MMIC 400 is kept in physical contact with pad 220 by a conductive epoxy, soldering, any suitable method of electrically conductive bonding, and/or any other suitable method of securing MMIC 400.

In accordance with various embodiments, MMIC 400 is electrically connected to leadframe 200 via wirebonds. More specifically, in various embodiments, MMIC 400 is attached to DC and RF interfaces (leads) at bond pads on the leads inside the package. For example, one or more bond pads on MMIC 400 may be connected to a bond pad on one or more of leads 250. Wirebonding is well known in the art and will not be described in further detail herein. Furthermore, flip chip, high density interconnect, and other suitable methods of electrically connecting MMIC 400 may be used as appropriate.

Figure 4B:
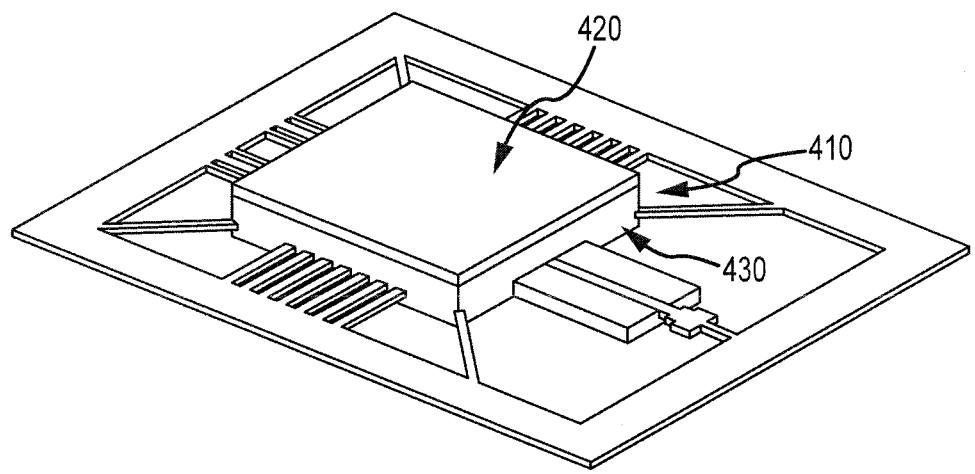

With reference now to FIG. 4B, the electronic device, die, or MMIC (as the case may be), may be enclosed in a package 410 (also described herein as "a package body portion"). Although it has been noted that the package may contain any electronic device or die, the package may for convenience be described herein as a MMIC package 410. But it should be understood that the disclosure is equally applicable to packages containing such other electronic devices.

Package (or MMIC package) 410 may suitably completely enclose the MMIC. In various embodiments, this enclosing of the MMIC may be effected by way of using a lid or through further overmolding. In other words, the MMIC may be enclosed in a package body portion comprising a package base and a package lid.

In various embodiments, MMIC package 410 or "the package body portion" may comprise a lid (package lid) 420 and an overmold box (or package body portion) 430. Lid 420, in various embodiments, comprises at least one of the following materials: injection molded plastic, ceramic, stamped plastic, metal, and/or the like. In various embodiments, these materials may be one of: metal plated and not metal plated. Furthermore, in various embodiments, a radio frequency absorbing material is provided on a first surface of the package lid. This first surface of the package lid may be described as facing the interior of the package. In various embodiments, the first surface may be described as facing the electronic device, facing the die, or facing the MMIC. Moreover, the radio frequency absorbing material, in one example embodiment, comprises "Ecosorb."

Lid 420 may be secured to overmold box 430 using any suitable technique. For example, a glue may be used to connect the two objects. In one example embodiment, a B-Staged Epoxy is used to attach lid 420. Furthermore, in various embodiments, lid 420 is sealed to overmold box 430. Such sealing may be performed, for example using an ultrasonic lid seal. Furthermore, any suitable techniques may be used for sealing or otherwise attaching lid 420 to overmold box 430. In various embodiments, the seal may be a hermetic seal.

Thus, in accordance with various embodiments, a MMIC package (or overmolded package body portion) may comprise: a package lid and an overmolded package base; wherein the package lid and the overmolded package base are connected together so as to hermetically seal the die within a cavity inside the overmolded package body portion.

Figure 10A:
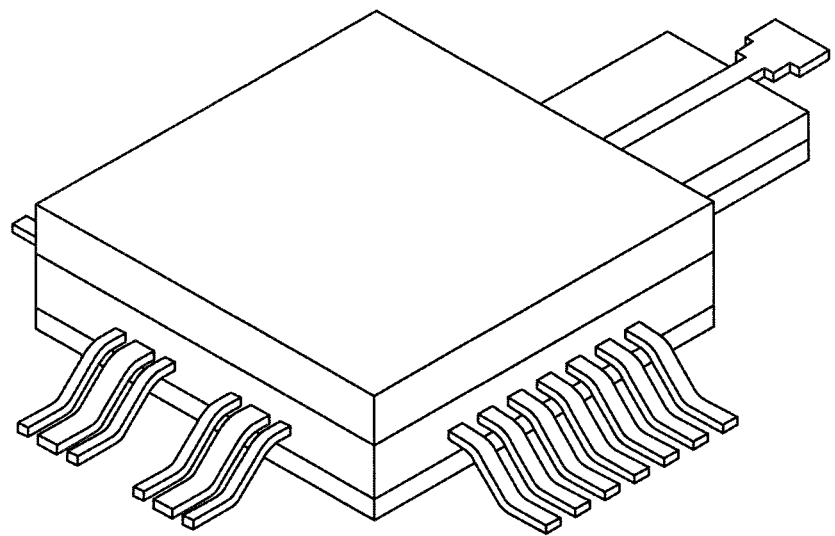
FIGS. 10A-10B illustrate, with top and bottom perspective view respectively, an example package after the leads have been trimmed and shaped in accordance with a second example embodiment.
Figure 10B:
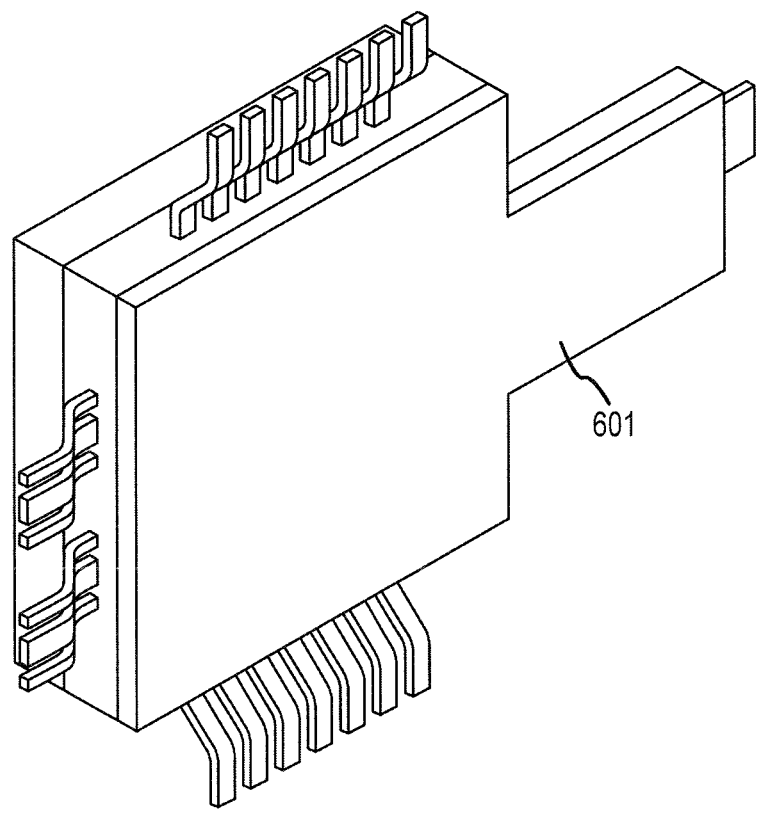
Figure 10C:
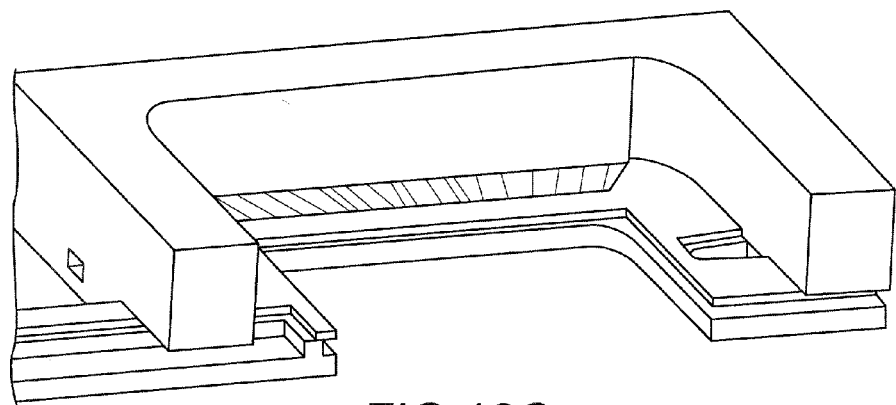
FIG. 10C illustrates an example cut away view of the overmold package with only the overmold material showing, in accordance with an example embodiment.
Figure 10D:
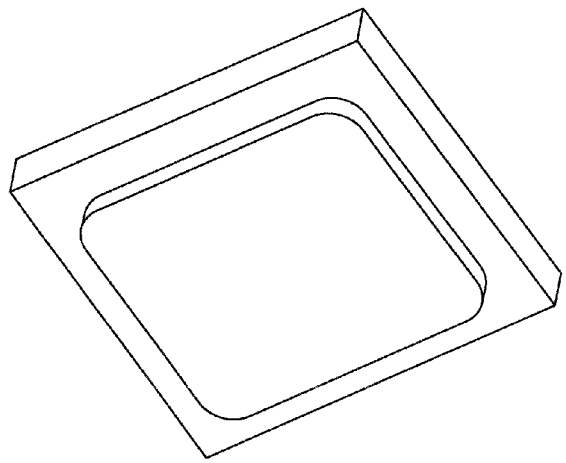
FIG. 10D illustrates an example lid in accordance with an example embodiment.

In one example embodiment, and with momentary reference now to FIG. 10D, an example lid may comprise a raised middle portion. This raised middle portion may be configured to facilitate alignment of the lid and base portion, and/or sealing/attaching of the lid to the base portion. In another example embodiment, the raised middle portion is configured to facilitate positioning the RF absorbing material that is attached to the raised middle portion.

In accordance with other example embodiments the overmolded package is a fully encapsulated overmolded package. In various embodiments, the MMIC is fully encapsulated by adding overmold material over the MMIC after placing/wirebonding the MMIC within the overmolded package. For example, injection molding may be used to finish encapsulating the MMIC in the package.

Figure 5A:
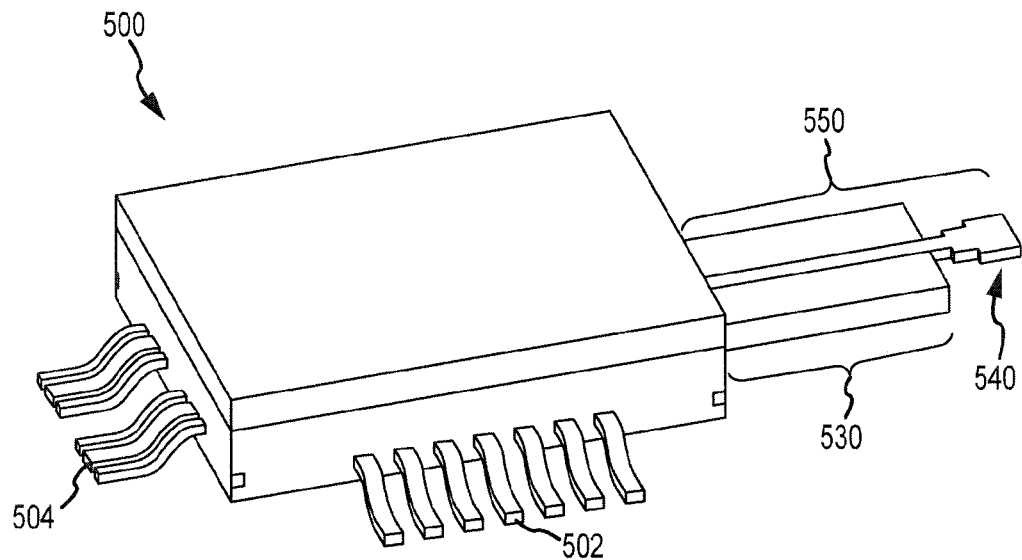
FIGS. 5A-5B illustrate, with top and bottom perspective view respectively, an example package after the leads have been trimmed and shaped in accordance with a first example embodiment.
Figure 5B:
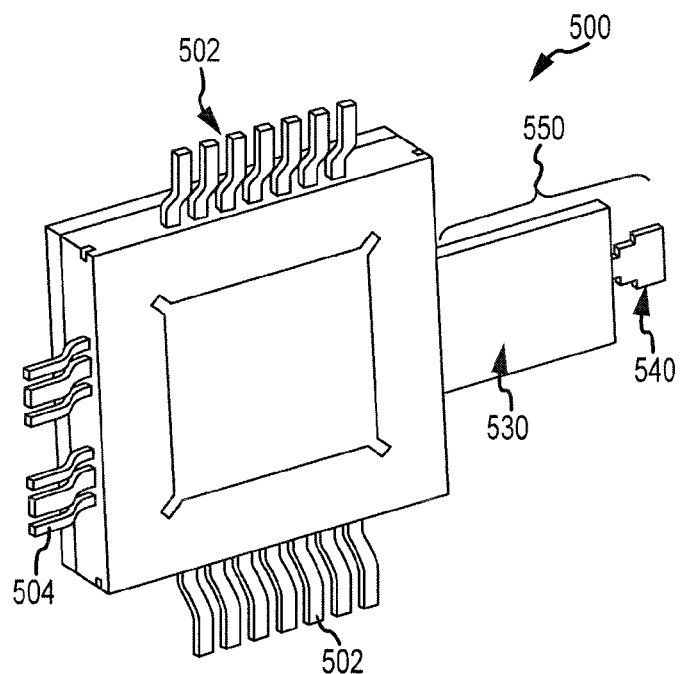

With reference now to FIGS. 5A and 5B, the MMIC package may be further processed by bending the protruding leads into a desired shape as may be further described below. The leads may comprise, for example, bias input leads 502, and microwave input leads 504.

In various embodiments, a MMIC package 500 further comprises an integrated partial waveguide interface 550. Integrated partial waveguide interface 550 may further comprise a microstrip portion 530 and a launch 540. Again, it is noted that the microstrip could be any suitable structure for communicating an RF signal along integrated partial waveguide interface 500 (e.g., waveguide transition, coaxial, and or the like). The microstrip portion 530 may comprise a microstrip and an overmold material. The microstrip may be at least partially overmolded. Stated another way, the microstrip may be at least partially supported, by an overmold material. In one example embodiment, the overmold material may be only on one side of the microstrip. In another example embodiment, the microstrip may be covered by the overmold material. Furthermore, although shown as covering the entire length of the microstrip, the overmold material may only be in contact with the microstrip for a portion of its length. Thus, the overmold material may be in contact with at least a portion of the microstrip.

Although described herein as a package comprising an integrated partial waveguide interface, in various embodiments, the waveguide interface is not integrated with the MMIC package. Moreover, the partial waveguide interface may comprise a transmission line (e.g., microstrip, coaxial, stripline). The stripline may be, for example, a suspended stripline. In various embodiments where the overmold material is under the microstrip, the overmold material may be from 2 mils to 60 mils thick, and in various embodiments may be 5 mils to 30 mils thick, and in various embodiments may be about 10 mils thick. Furthermore, any suitable thickness of overmold material under the microstrip may be used.

The microstrip portion may facilitate providing a filtering function for the signal communicated along the microstrip. In this regard, the overmold may be a dielectric material. The microstrip portion may function as a suspended strip-line. In various embodiments, the microstrip portion is a 50 ohm line. Moreover, the line, in various embodiments, may be configured to have an impedance in the range of 5 ohms to 400 ohms. Furthermore, any suitable impedance for the line may be used. In various embodiments, the microstrip portion is configured to extend the probe from the package. In various embodiments, the microstrip portion may extend a short distance, such as from 0.1 inches to 1 inch. However, any suitable extension length may be used.

In various embodiments, the word integrated in the phrase "integrated partial waveguide interface" means that the overmold material of the microstrip portion 530 is integral with the overmold material of the overmold package. The microstrip portion 530 may comprise the same overmold material as used in the rest of the overmolded package. In other various embodiments, different overmold material may be used in different locations of MMIC package 500.

In various embodiments, launch 540 is not overmolded. In other various embodiments, launch 540 is overmolded on one side. For example, the overmold material may extend under the probe. The supporting material may thus be in contact with all of the microstrip, and/or part or all of the launch. Such variations may involve tradeoffs with respect to signal quality and robustness.

In accordance with various embodiments, launch 540 is an e-plane launch. As an e-plane launch, launch 540 is configured to launch a signal into a waveguide perpendicular to the microstrip/launch. In accordance with other various embodiments, launch 540 is an H-plane launch. As an H-plane launch, launch 540 is configured to launch straight ahead. Furthermore, launch 540 may be any suitable type of launch or may comprise any other waveguide transition known or hereinafter discovered.

In some embodiments, MMIC package 500 comprises more than one integrated partial waveguide interface. For example, one integrated partial waveguide interface may be an input interface and another integrated partial waveguide interface may be an output interface. In other example embodiments, multiple input and/or output interfaces may be formed as integrated partial waveguide interfaces. One example embodiment may comprise two or more input interfaces and a single output interface, all configured as integrated partial waveguide interfaces. Another example embodiment may comprise a single input interface and two or more output interfaces, all configured as integrated partial waveguide interfaces.

It is noted, with reference to FIG. 5B, that pad 220, also known as a "die paddle" is located in the package so as to be flush with the bottom of MMIC package 500. In one example embodiment where the die paddle is not flush with the bottom of MMIC package 500, and with momentary reference now to FIG. 100, a slot in the overmold is configured to hold the leadframe.

It is further noted that the microstrip portion 530 and launch 540 of integrated partial waveguide interface 550 does not comprise a complete waveguide interface. At least a cover is missing to call it a complete waveguide interface. Thus, interface 550 is denominated a partial waveguide interface. And because this partial waveguide interface is integral with the MMIC package, it is more particularly denominated an integrated partial waveguide interface. Thus, MMIC package 500 comprises an integrated partial waveguide interface.

Stated another way, in accordance with various embodiments, a semiconductor device may comprise a MMIC package including a MMIC and a partial waveguide interface molded into the molded MMIC package. In accordance with another example embodiment, a mm-wave MMIC package comprises an overmolded leadframe package and an integrated wave guide interface that does not include an integrated waveguide backshort. In accordance with another example embodiment, a mm-wave MMIC package comprises an overmolded leadframe package and an integrated partial wave guide interface, wherein the integrated partial waveguide interface is configured to work in conjunction with a separate waveguide backshort.

In accordance with another example embodiment, a high power, high frequency MMIC package comprises one or more integrated partial waveguide interfaces, wherein the MMIC in the MMIC package is one of a power amplifier and a block up-converter. In this example embodiment, each of the one or more integrated partial waveguide interfaces are one of: an input interface and an output interface. In another example embodiment, each of the one or more integrated partial waveguide interfaces comprise: two input interfaces and two output interfaces. In various embodiments, an amplifier comprises both a waveguide input and a waveguide output.

One example embodiment may comprise a QFN package plus "half" a waveguide interface. The other portion or "half" is provided at a higher assembly level, as discussed in further detail herein.

Figure 6:
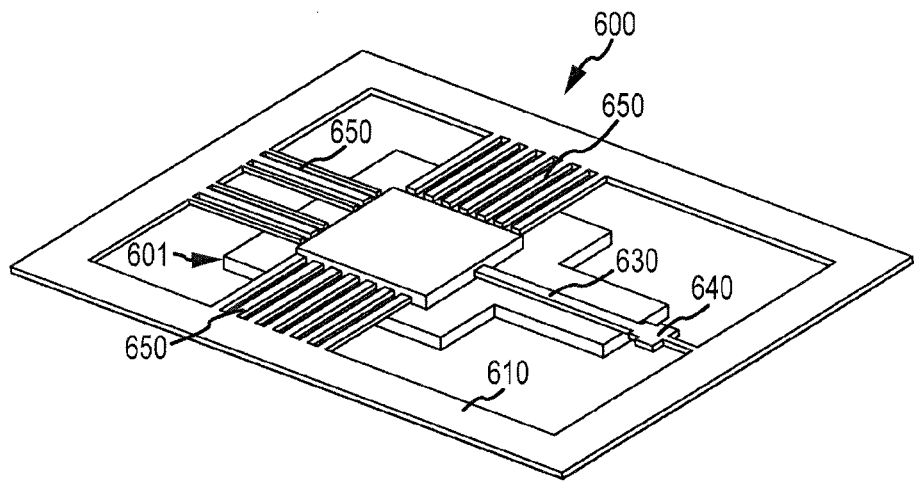
FIG. 6 illustrates an example double leadframe in accordance with an early step in the assembly process in a second example embodiment.

In accordance with a different example embodiment, and with reference to FIG. 6, two leadframe assemblies may be used in forming a MMIC package. One of the two leadframe assemblies may be formed much like the leadframe assembly described with reference to FIG. 2A. For example, a leadframe 600 may comprise a frame 610, a pad 620, a strip-line 630, a launch 640, and leads 650. Furthermore, a second leadframe 601 may be formed. The leadframes may be formed using similar techniques as described above, and so that discussion will not be repeated here. It will be noted, however, that pad 620 is discarded, and that support structures for such pad 620 may be omitted in this example embodiment. For simplicity, the term leadframe package is intended to include a package formed using one leadframe or a package formed using multiple leadframes. The use of a second leadframe provides another degree of freedom in design in that the thickness and/or materials of the second leadframe can differ from that of the first leadframe. This facilitates making the base leadframe thicker without impacting the thickness of the leads.

Figure 7:
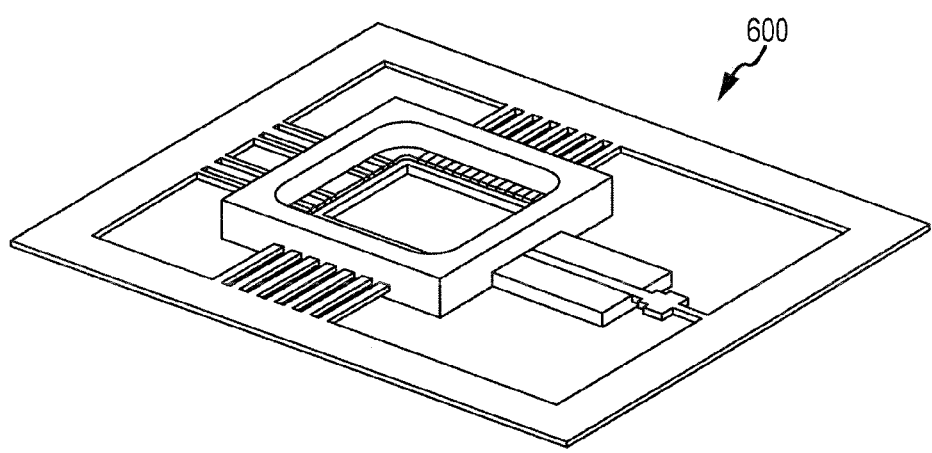
FIG. 7 illustrates an example double leadframe after transfer molding in accordance with a second example embodiment.
Figure 8:
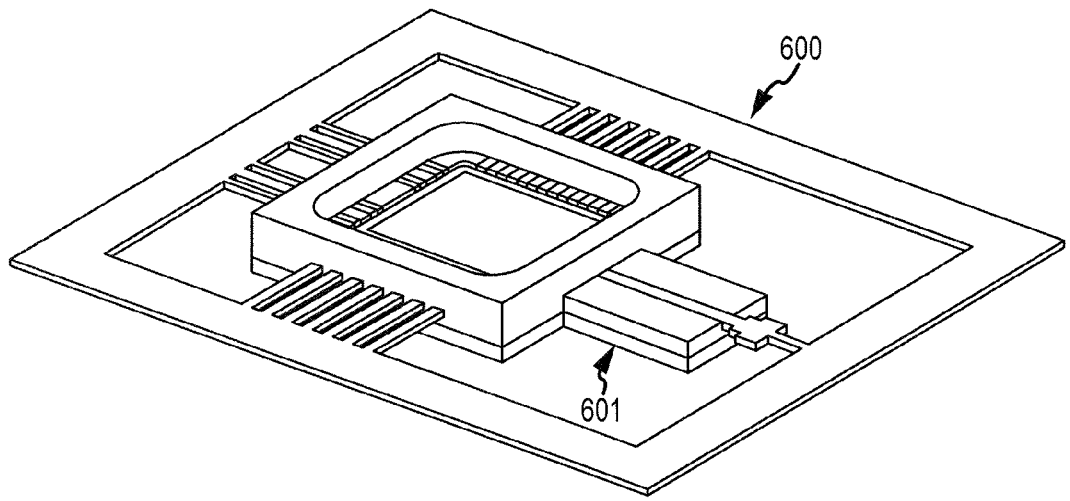
FIG. 8 illustrates an example transfer molded double leadframe of FIG. 7 with a base bonded thereto, in accordance with a second example embodiment.

With reference now to FIG. 7, leadframe 600 may be overmolded similar to the overmolding described with reference to FIG. 3. It is noted that, in various embodiments, there is no pad (also known as a base or pedestal) at this stage in the overmolding process. The second leadframe 601 (also known as a base leadframe) may, with reference to FIG. 8, be bonded to the overmolded first leadframe. This can be done, for example, in an array of leadframes.

Figure 9A:
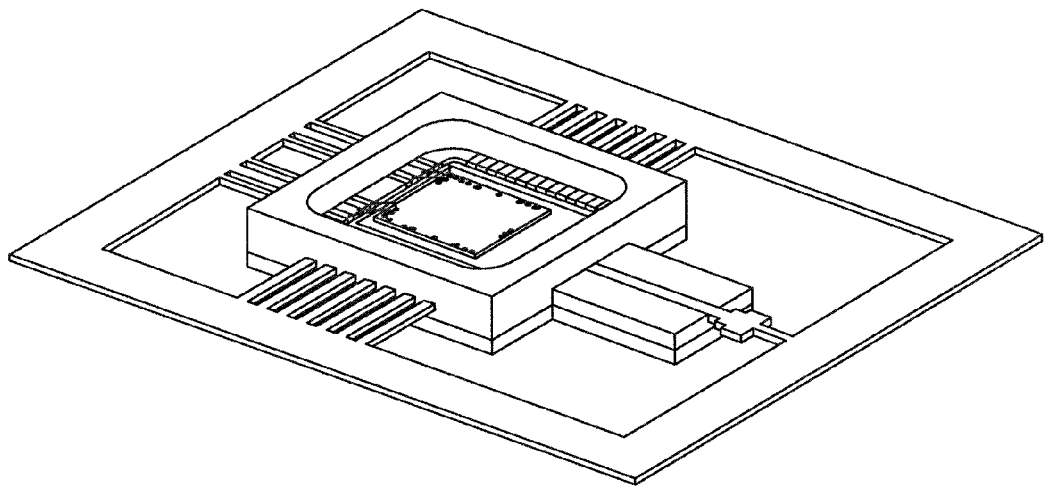
FIGS. 9A-9B respectively illustrate an example package after adding an example die and after adding an example lid in accordance with a second example embodiment.
Figure 9B:
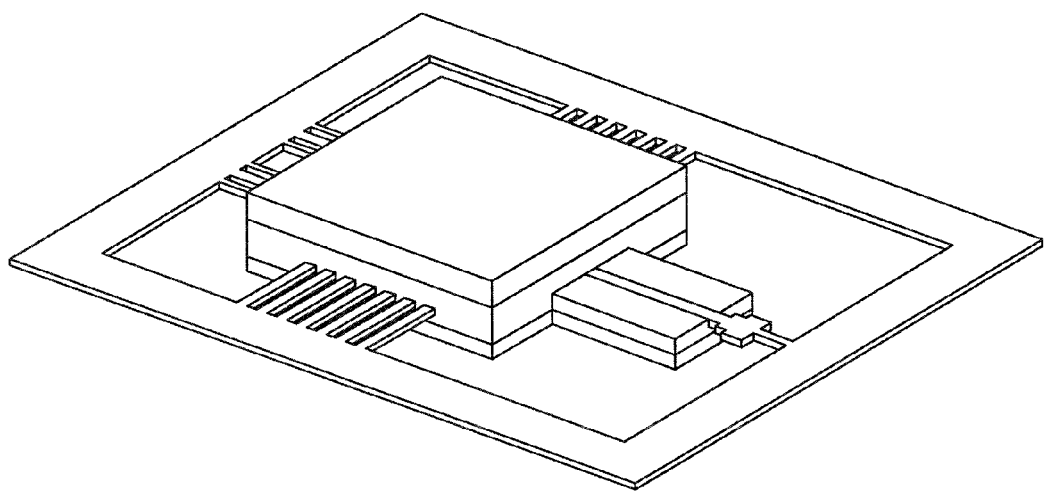

With reference now to FIGS. 9A-9B, an electronic device, die, or MMIC is positioned inside the overmolded leadframe package, and wirebonded as described above. In this example embodiment, however, the electronic device is in contact with the base leadframe instead of with a pad from the first leadframe. The electronic device may be enclosed within the package as described above. For example, using a lid or overmolding to enclose or encapsulate the device. The double leadframe MMIC package is then trimmed from the frame of the first leadframe and the leads are shaped. These steps may take place as described above. With reference now to FIGS. 10A and 10B, the resulting MMIC package 1000 is similar to that described with reference to FIGS. 5A and 5B, except that base leadframe 601 extends under the entire package. In other various embodiments, base leadframe 601 extends under only a portion of the entire package.

Figure 10E:
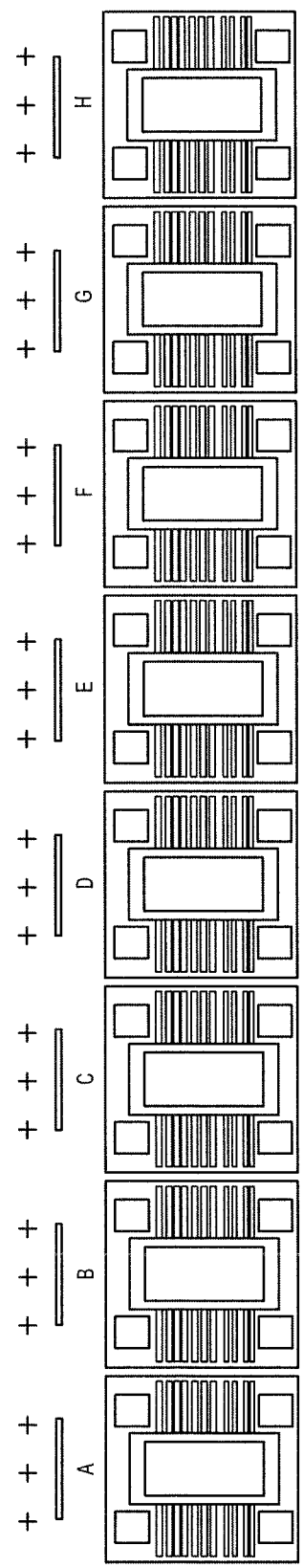
FIG. 10E illustrates an example side-by-side leadframe processing strip, in accordance with an example embodiment.

In accordance with another example embodiment, the package may be processed in parallel with the making of other packages. For example, several packages may be formed simultaneously in the same leadframe. With momentary reference to FIG. 10E, an example 8×1 strip may be used for forming the leadframe, overmolding the formed leadframe, inserting the MMIC, and encapsulating/enclosing the MMIC. Any suitable number and arrangement of devices may be used for simultaneously processing several packages at the same time.

Thus, in accordance with various embodiments, a MMIC package may comprise: a leadframe based overmolded package ("overmolded package"), a die positioned within the overmolded package; and a partial waveguide interface, wherein the partial waveguide interface is integral with the overmolded package. In various embodiments, the overmolded package does not comprise a printed wiring board.

Turning now in more detail to a discussion of the leads, in various embodiments, use of the package in a surface mount configuration is anticipated. Such surface mount use may give rise to mechanical stresses in the package and tends to give rise to a need for tight tolerances. Because such stresses and tight design criteria for the tolerances are typically undesirable, in one example embodiment, spring like leads are used at the DC and RF interfaces. These spring like leads are configured to take up mechanical stresses and tolerances. For example, the spring leads are designed to have a suitable length and shape. Unfortunately, a mechanically elastic design may be inclined towards longer leads with a larger height, whereas at microwave frequencies, a better electrical performance will be achieved with shorter leads having little height.

Therefore, in various embodiments, the length and shape of the leads are designed to optimize mechanical elastic properties as well as electrical performance properties. Thus, various RF tuning techniques may be implemented in the design of the leads.

Figure 11A:
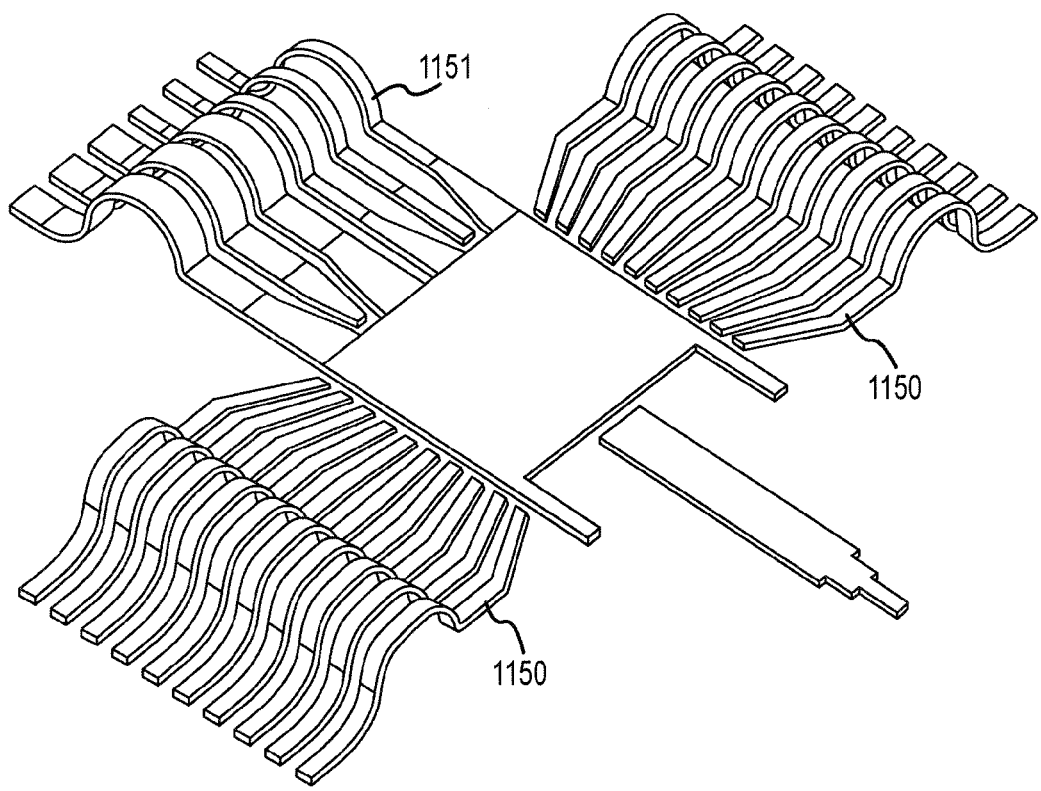
FIGS. 11A-11C illustrate, in perspective view, example leadframe embodiments (with or without the overmold), in accordance with various embodiments.
Figure 11B:
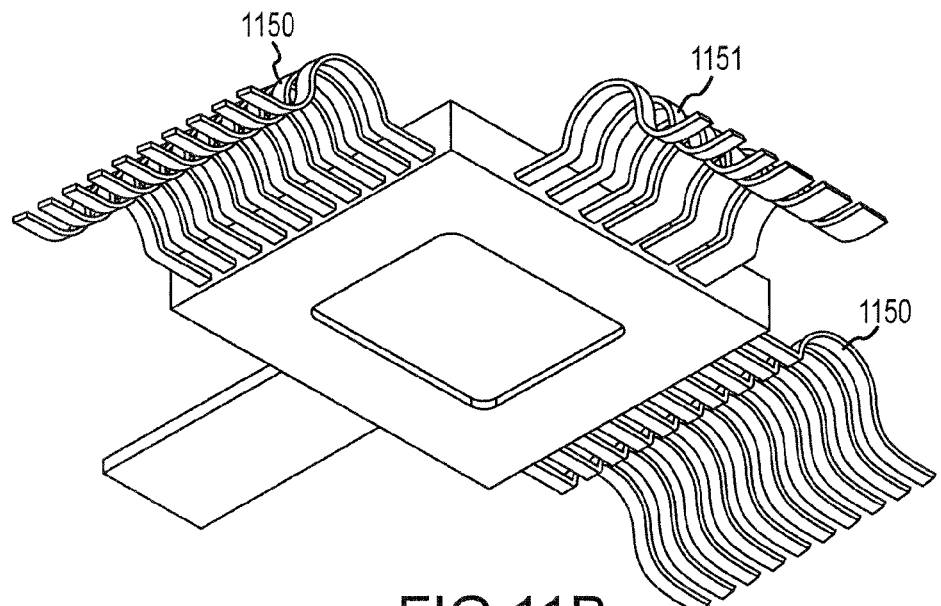
Figure 11C:
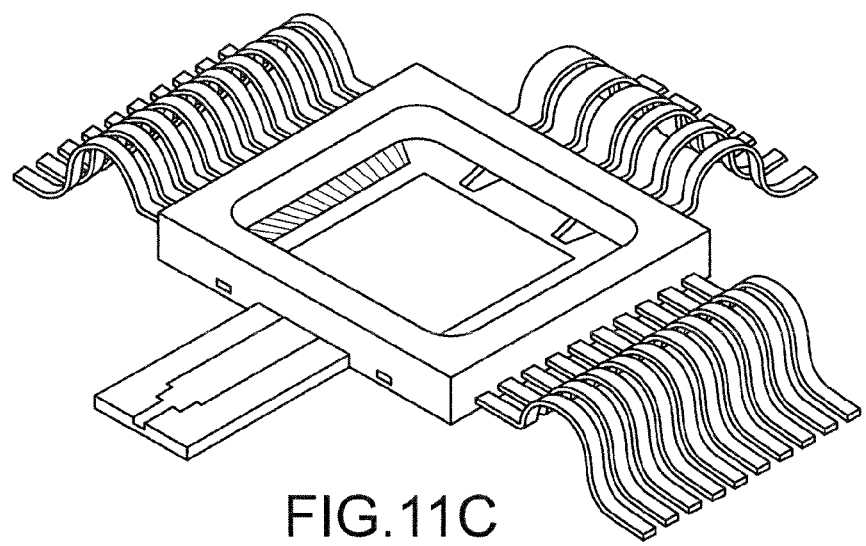

With reference now to FIGS. 11A-11C, leads 1150 and 1151 may be formed (e.g., using cutting or stamping, or the like) and shaped. The leads form at least one DC interface and at least one RF interface. In various embodiments, the DC and RF interfaces are configured to connect electrically to a printed wiring board ("PWB"). The leads may have an "S" shape, in one example embodiment. In other various embodiments, any shape may be used that provides a spring like flexibility facilitating reduced stress and good contact when the package is surface mounted to the next higher assembly level. The leads may be designed to take up 2-9 mils or more of deflection. Moreover, in various embodiments, some applications may involve the leads taking up deflection on the order of 100 mils. Thus, the leads may be configured to take up any desired amount of deflection. Moreover, the leads may be 160 mils long, however any suitable length of the leads to facilitate taking up the desired deflection may be used.

It is noted that leads 1150 may be DC bias leads, and leads 1151 may be RF leads. In this regard, some RF tuning may be performed by designing the leads in such a way as to offset the RF performance issues that may arise due to the length of the leads. It is noted that these tuning techniques are dependent on the frequency of the RF signals. The intermediate frequency signal and local oscillator signals conveyed over leads 1151 each are associated with a frequency and the design of the leads for tuning will generally be based on that frequency.

Figure 12A:
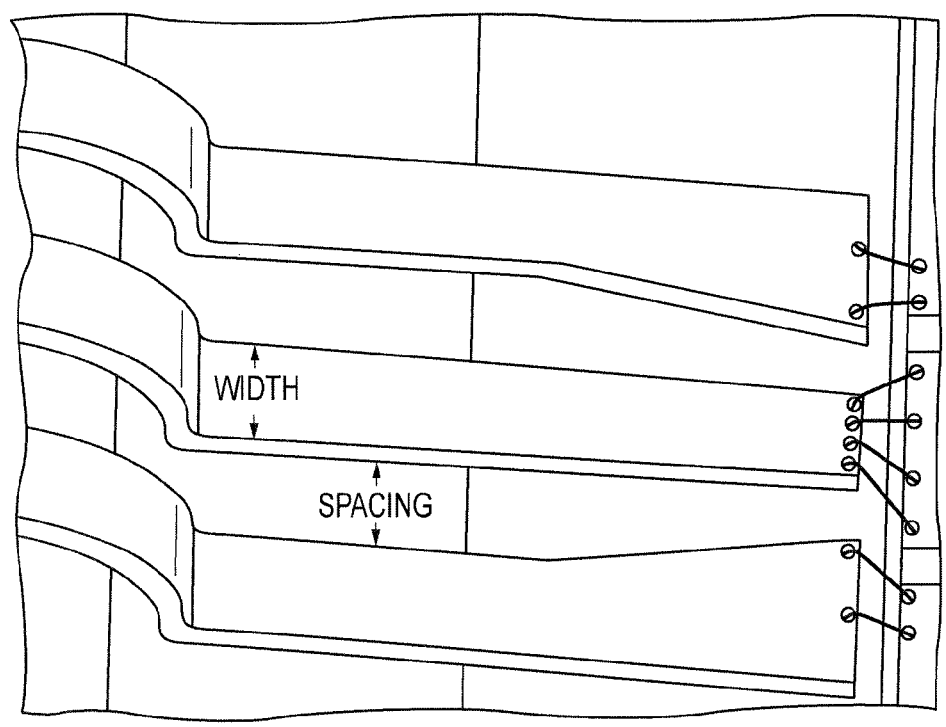

For example, and with reference now to FIGS. 11A and 12A-F, the spacing between leads may be used to affect tuning (e.g., FIG. 12A). In another example embodiment, the width of the leads may be used to effect tuning (e.g., FIG. 12A). In another example embodiment, some of leads 1151 may be designed with specific shapes in the vicinity of the package overmold. Such shapes may facilitate impedance tuning.

In various embodiments, shaped leads might comprise: tapered leads (e.g., FIG. 12B), straight leads (e.g., FIG. 12C), neck-up leads (e.g., FIG. 12D—showing the lead getting wider and then narrower) in certain areas, and neck-down leads (e.g., 12E—showing the lead stepping down to a narrow lead and then stepping back up in width. Such shaping may occur during the process of cutting out the leadframe shape. Furthermore, any other suitable tuning methods may be used for on-package tuning, such as customizing the wire lengths, adjusting the positions of the end of the wire on the leads, and adjusting the proximity to ground.

Figure 12F:
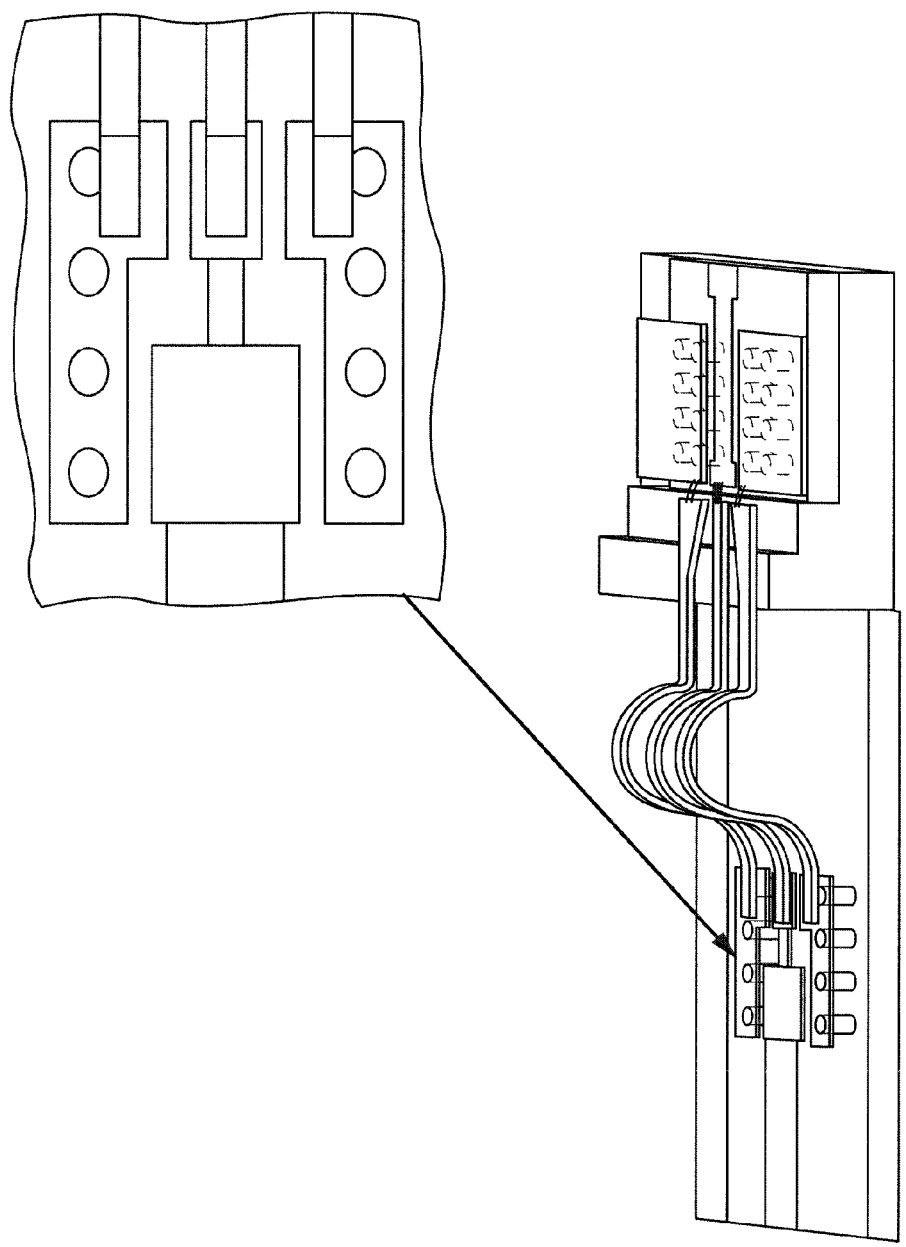

Moreover methods of tuning the RF signal carried over the leads may be implemented at the package/PWB interface. With reference now to FIG. 12F, in another example embodiment, off-package tuning techniques are utilized to further tune the RF signal to compensate for the length of the leads. Such off package lead tuning techniques may include use of shaped leads on the printed wiring board (similar to shaped leads used on the MMIC package). Such may also involve a ground-signal-ground arrangement (coplanar waveguide structure).

In accordance with various embodiments, the MMIC package may be used in the next higher assembly level. For example, the MMIC package may be used in a transceiver. Moreover, the MMIC package may be used in any suitable higher level assembly. For example, the MMIC package may be used in high power amplifiers and/or high power millimeter wave modules, or any suitable higher level assembly.

In such higher level assemblies, the MMIC package may be surface mounted. Several embodiments of such an assembly are described, but other assemblies may also be implemented. In one example embodiment, the MMIC package is placed on a printed wiring board ("PWB"). The PWB is placed on a chassis and/or within a housing.

Figure 13:
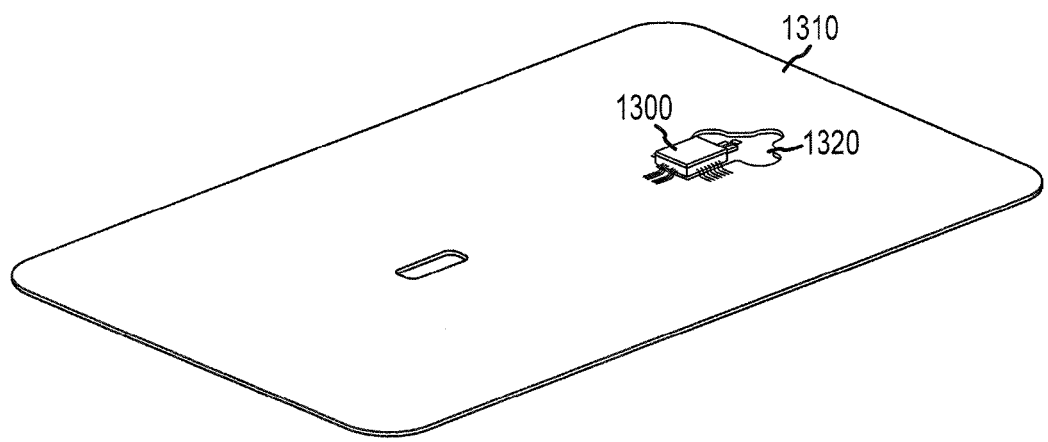
FIG. 13 illustrates an example package placed on an example printed wire board, in accordance with various embodiments.

The PWB, in various embodiments comprises any type of printed wiring board (also known as printed circuit board). The PWB is configured to facilitate surface mounting of the MMIC package. With reference now to FIG. 13, an example PWB 1310 may be connected to MMIC package 1300. MMIC package 1300 may be physically positioned on PWB 1310 using pick-and-place technology. Moreover, any suitable method of placing MMIC package 1300 on PWB 1310 may be used. Various leads of MMIC package 1300 may connect with bond pads on PWB 1310. The leads, in one example embodiment are reflow soldered to the bond pads. Moreover, any suitable infrared reflow, wave soldering, or any other suitable surface mounting techniques may be used to electrically connect MMIC package 1300 to PWB 1310.

Figure 14A:
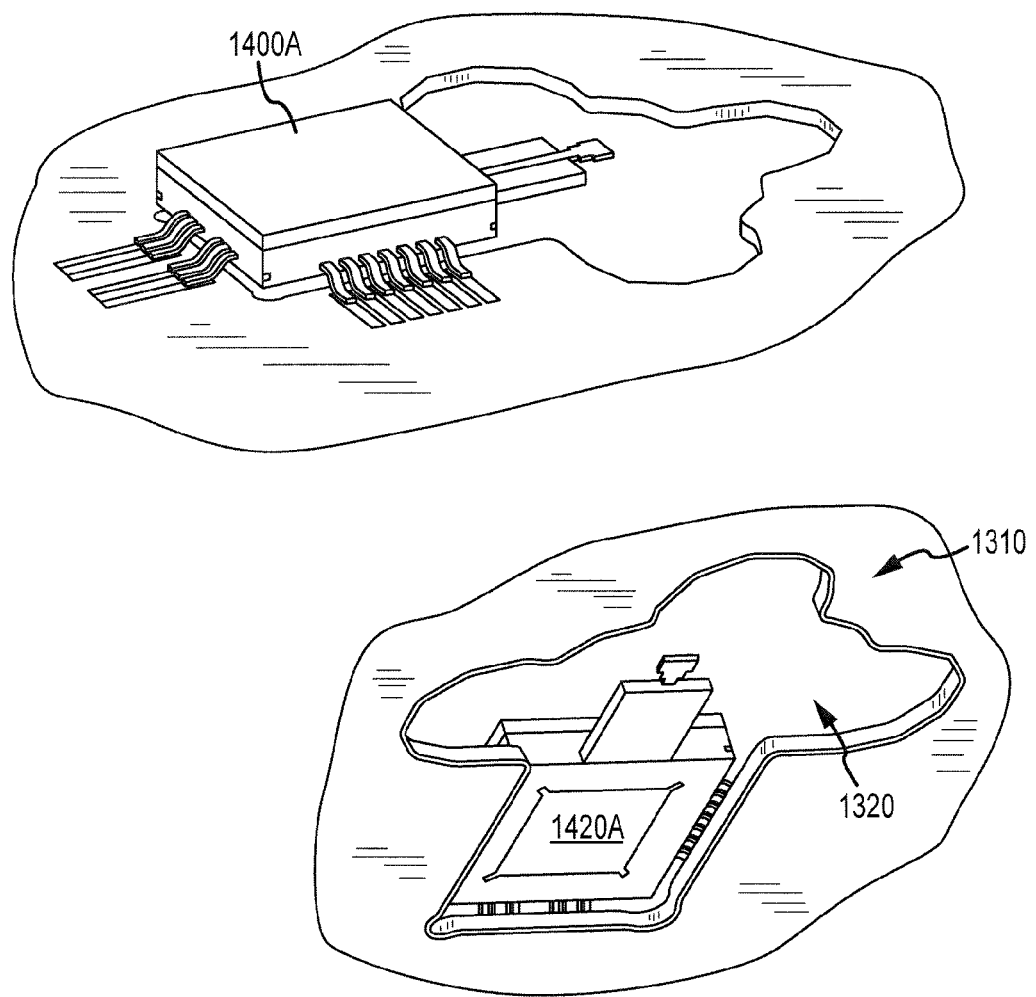
FIGS. 14A-14B respectively illustrate two different example packages placed on an example printed wireboard, in accordance with two different example embodiments.
Figure 14B:
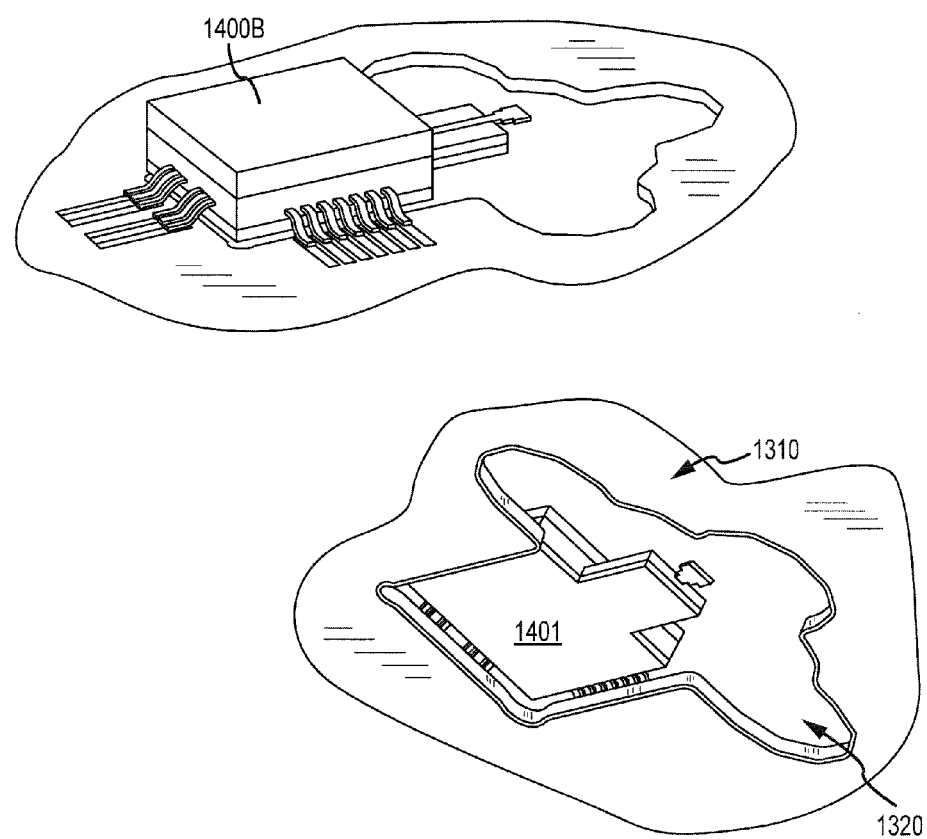

PWB 1310 may further have a hole 1320. Hole 1320 is, in one example embodiment configured to facilitate thermal and RF communication between MMIC 1300 and the chassis on which PWB 1310 is to be connected. Hole 1310 may be any size or shape as suitable. Hole 1320 may also be referred to as a "part bridge." With reference now to FIGS. 14A and 14B respectively, it is noted that for either of the example embodiments described above (i.e., a single leadframe package or a double leadframe package), the underside of MMIC packages 1400A/1400B are exposed due to (or through) the part bridge 1320 cut in PWB 1310.

In this regard, part bridge 1320 is configured to facilitate MMIC package 1300 contacting a heat sink on a chassis via part bridge 1320. It will be noted that for MMIC package 1400A, the single leadframe package, the die paddle is aligned with part bridge 1320 in PWB 1310. Similarly for MMIC package 1400B, a double leadframe package, the base leadframe 1401 is aligned with part bridge 1320 in PWB 1310. Thus, exposing the underside or "bottom" of packages 1400A and 1400B facilitates heat transfer to a heat sink located on the opposite side of PWB 1310.

Part bridge 1320 further provides a bridge to a waveguide located in a chassis, where the chassis is primarily located on the side of the PWB opposite MMIC package 1300. In these various embodiments, the launch is aligned over part bridge 1320.

Figure 15:
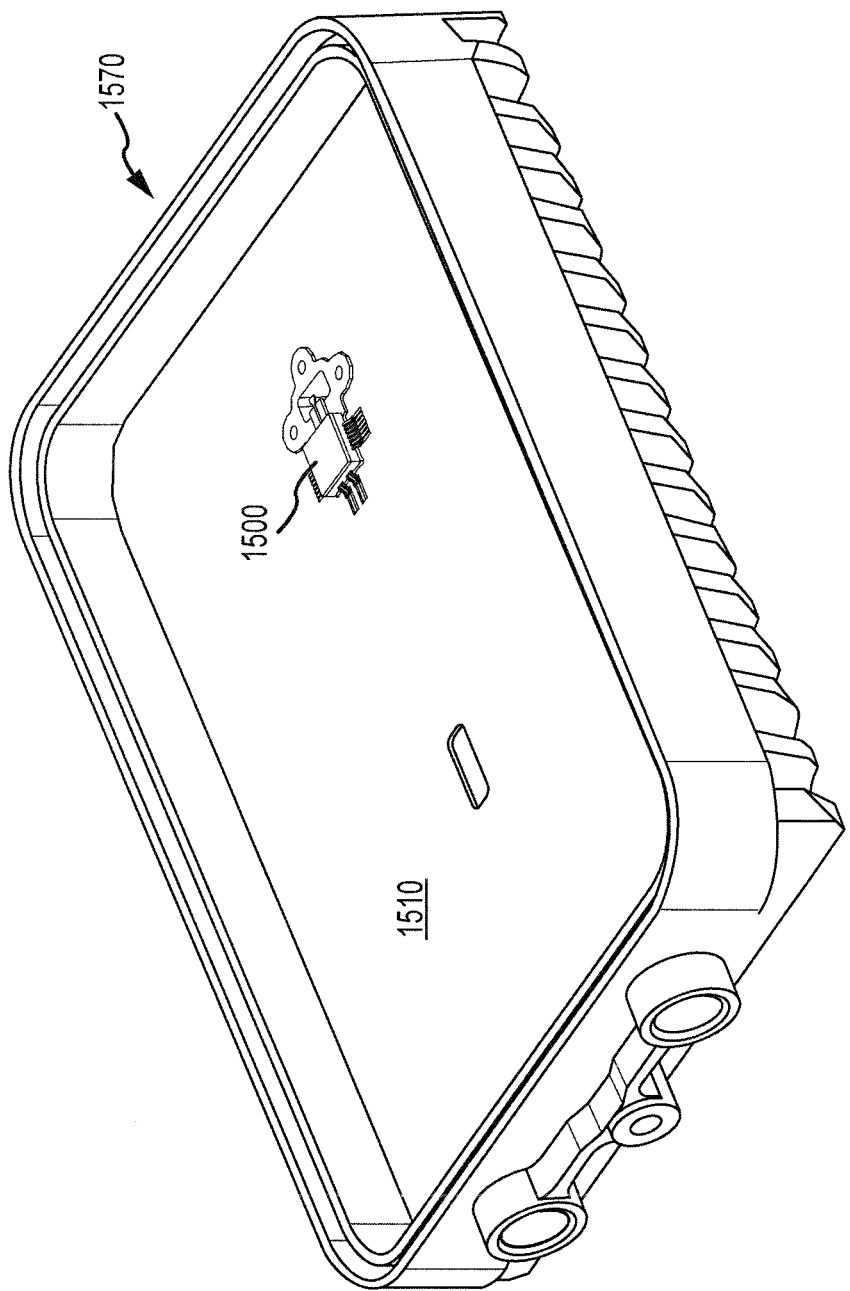
FIG. 15 illustrates an example assembly of FIG. 14 placed on an example chassis associated with an example housing of a transceiver, in accordance with various embodiments.

In accordance with a first example embodiment, and with reference now to FIG. 15, MMIC package 1500 is first electrically connected to PWB 1510 and then PWB 1510 is placed in contact with a chassis. In accordance with another example embodiment, PWB 1510 is connected to the chassis and then MMIC package 1500 is connected to PWB 1510.

Either way, in accordance with various embodiments, a transceiver (e.g., transceiver 110 from FIG. 1) may comprise a housing into which PWB 1510 and MMIC package 1500 are placed. The transceiver housing may comprise a first portion and a second portion. The first portion may also be called a top portion and the second portion may be called a bottom portion. Furthermore, the first portion may be called a lid in some example embodiments. The first portion/top portion/lid is not illustrated, but an example second portion or bottom portion 1570 is illustrated in FIG. 15.

It will be noted that in various embodiments, bottom portion 1570 of the housing may be called a chassis. In other words, the chassis and the bottom portion 1570 of the housing may be one part. In other example embodiments, the bottom portion 1570 of the housing may be formed from multiple parts. In this second example embodiment, a chassis may be configured to drop into bottom portion 1570 of the housing. Thus, PWB 1510 may be located on bottom portion 1570 or PWB 1510 may be located on a chassis that is located on bottom portion 1570. Non-limiting examples of housing and chassis embodiments are disclosed in U.S. patent application Ser. No. 12/268,840, "Integrated OMT" and Ser. No. 12/614,185, "Molded Orthomode Transducer" the contents of which are incorporated by reference in their entirety for their treatment of example higher level assemblies.

In any event, PWB 1510 comprises a first side and a second side opposite the first side. MMIC package 1500 may be on the first side and a structure that is attached to the second side may comprise a waveguide. This structure will be generically called a chassis herein and it will be understood that the chassis is a portion comprising a waveguide and a heat sink, regardless of the number of components or configuration of the chassis/bottom portion of the housing.

Figure 16A:
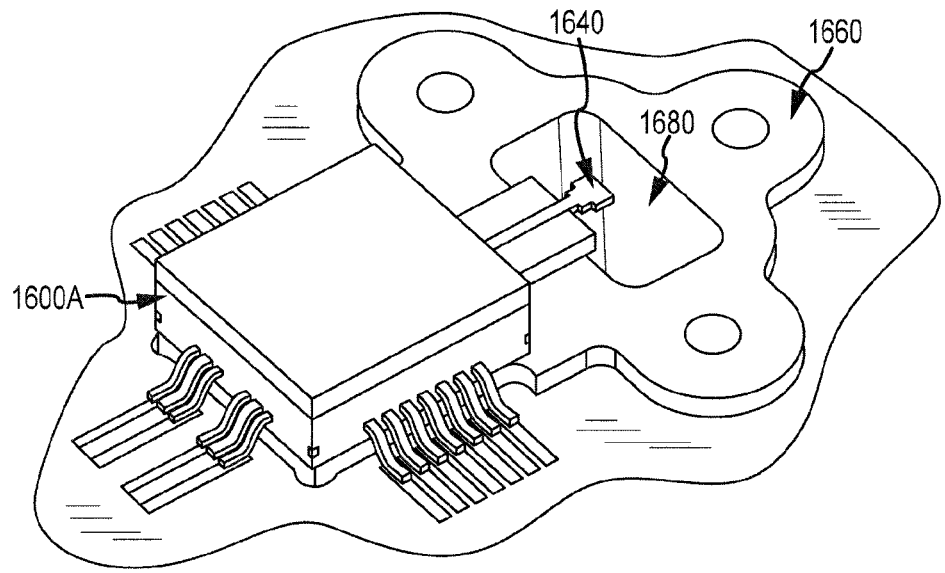
FIGS. 16A-16B respectively illustrate close up views of two different example packages placed on an example printed wireboard that is placed on an example chassis, in accordance with two different example embodiments.
Figure 16B:
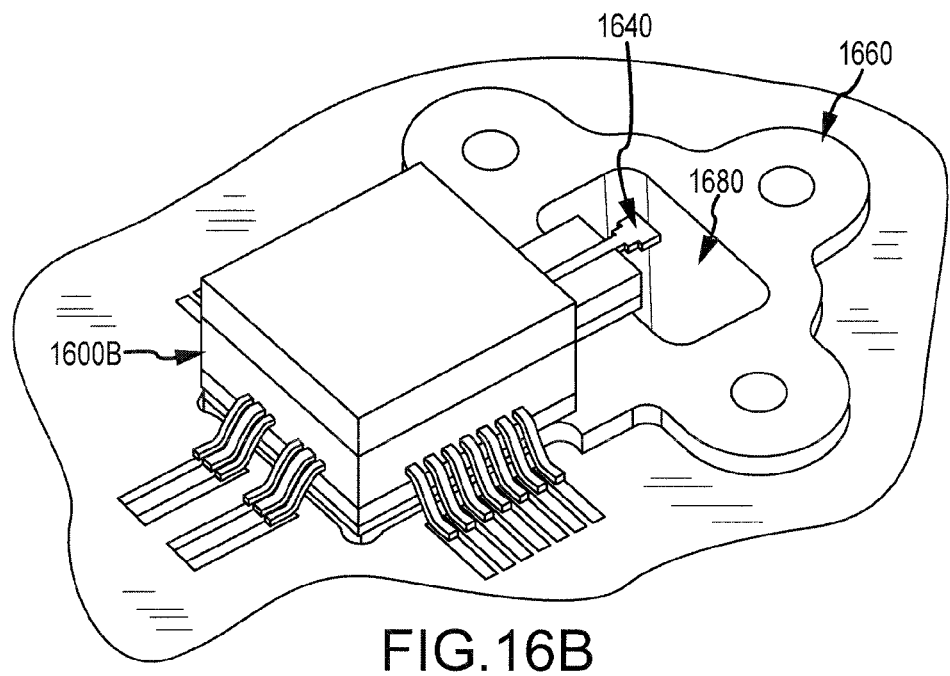

The chassis may comprise a pedestal. The pedestal may be a raised portion of the chassis. The raised portion, in various embodiments is configured to extend through the part bridge in the PWB. With reference now to FIGS. 16A and 16B, single leadframe and double leadframe MMIC packages 1600A and 1600B, respectively, in various embodiments, are in contact with a raised pedestal 1660 of the chassis. Moreover, launch 1640 is suspended over a waveguide 1680.

With reference now to FIGS. 17A-17D, a pedestal may exist on the chassis. In various embodiments, a pedestal 1760 is a raised portion of chassis 1770. Pedestal 1760 may be formed by removing material from chassis 1770. For example, material may be removed by etching, grinding, laser ablation, chemical etching, stamping/coining and/or the like. In another example embodiment, pedestal 1760 is formed by adding material to chassis 1770. For example, material may be added by welding, deposition, and or other suitable techniques. Moreover pedestal 1760 may be formed by casting, metal injection molding, and/or the like. Any suitable method of making pedestal 1760 may be used.

Pedestal 1760 may be formed of the same material as chassis 1770. In another example embodiment, pedestal 1760 is formed from a different material than chassis 1770. The pedestal and/or chassis material may comprise one of the following: metal, aluminum alloy, copper, zinc, or any metal alloy. Moreover, pedestal and/or chassis material may comprise any suitable material.

Figure 17A:
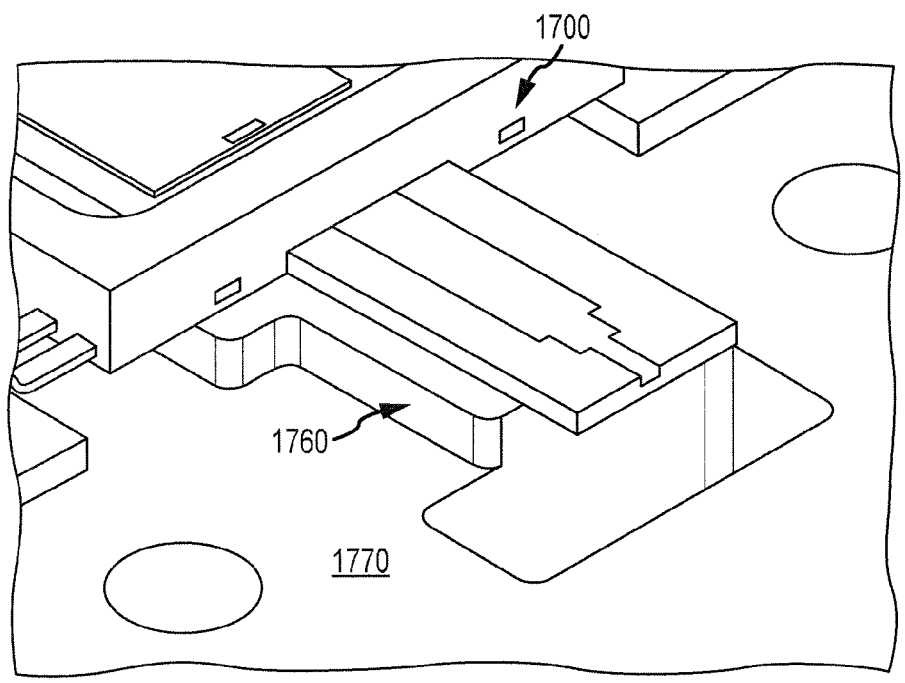
FIGS. 17A-17D illustrate various configurations of the chassis and an associated pedestal, a waveguide in the chassis, and the placement of these components relative to each other, in accordance with various embodiments.
Figure 17B:
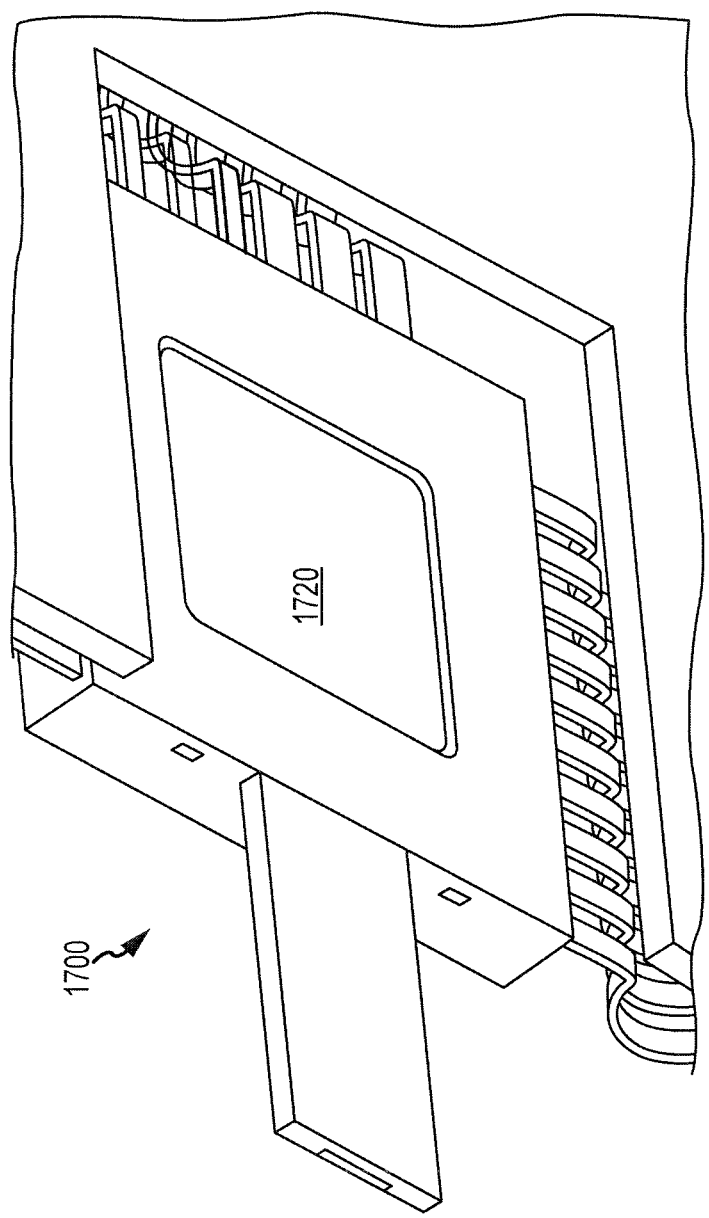

Pedestal 1760 may be configured to support MMIC package 1700. In another example embodiment, pedestal 1760 is configured to provide a thermal path from MMIC 1700 to chassis 1770. Therefore, in an example single leadframe MMIC package, such as illustrated in FIG. 17B, the pedestal may be shaped to fit inside the lip formed from the overmold material and to contact the pad 1720. In various embodiments then, pedestal 1760 may comprise multiple steps. Pedestal 1760 may for example comprise a first portion 1761 of a first height. Pedestal 1760 may for example comprise a second portion 1762 of a second height. The first portion 1761 may suitably support the overmold material and/or microstrip portion of MMIC package 1700. The second portion 1762 may be configured, in various embodiments to make a thermal contact with the pad 1720 on the underside of MMIC package 1700. Thus, in various embodiments, second portion 1762 of pedestal 1760 may comprise a surface configured for being placed in thermal contact with pad 1720 of MMIC package 1700.

Figure 17C:
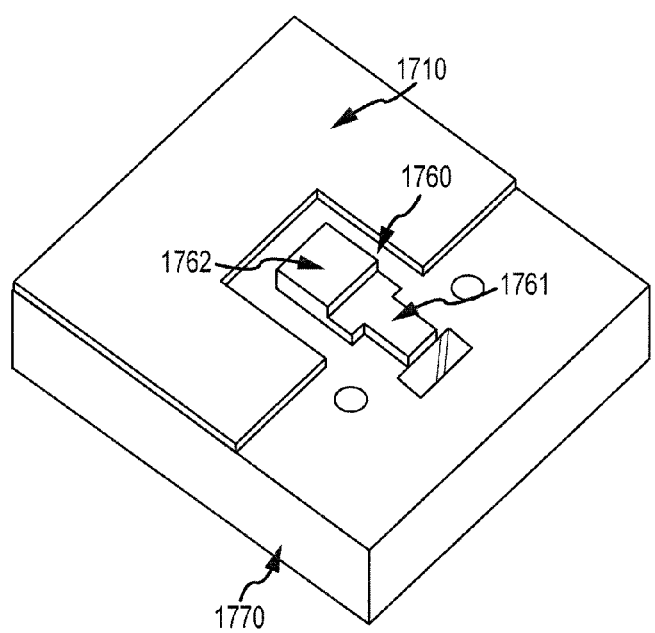

With reference to FIG. 17C, the pedestal may be at least partially surrounded by a PWB 1710. For example, PWB 1710 may be located on one end and partially on both sides of pedestal 1760. However, in another example embodiment, PWB 1770 may surround the pedestal (see for example, FIG. 15). PWB 1770 may be mounted to or in contact directly with chassis 1770. In other example embodiments PWB 1770 may be mounted to or in contact with one or more objects or layers that are mounted to or in contact with chassis 1770.

It should be noted that in the example embodiment comprising a double leadframe, the base leadframe is continuous and a single step pedestal may be used. For that matter, if the base leadframe is of sufficient height, the pedestal could be eliminated.

Figure 17D:
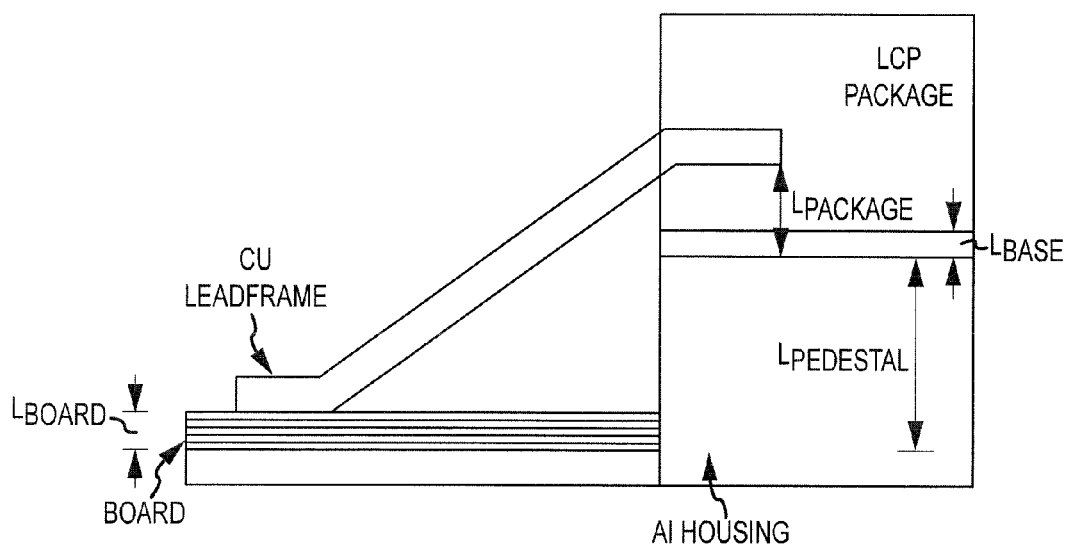
Figure 18A:
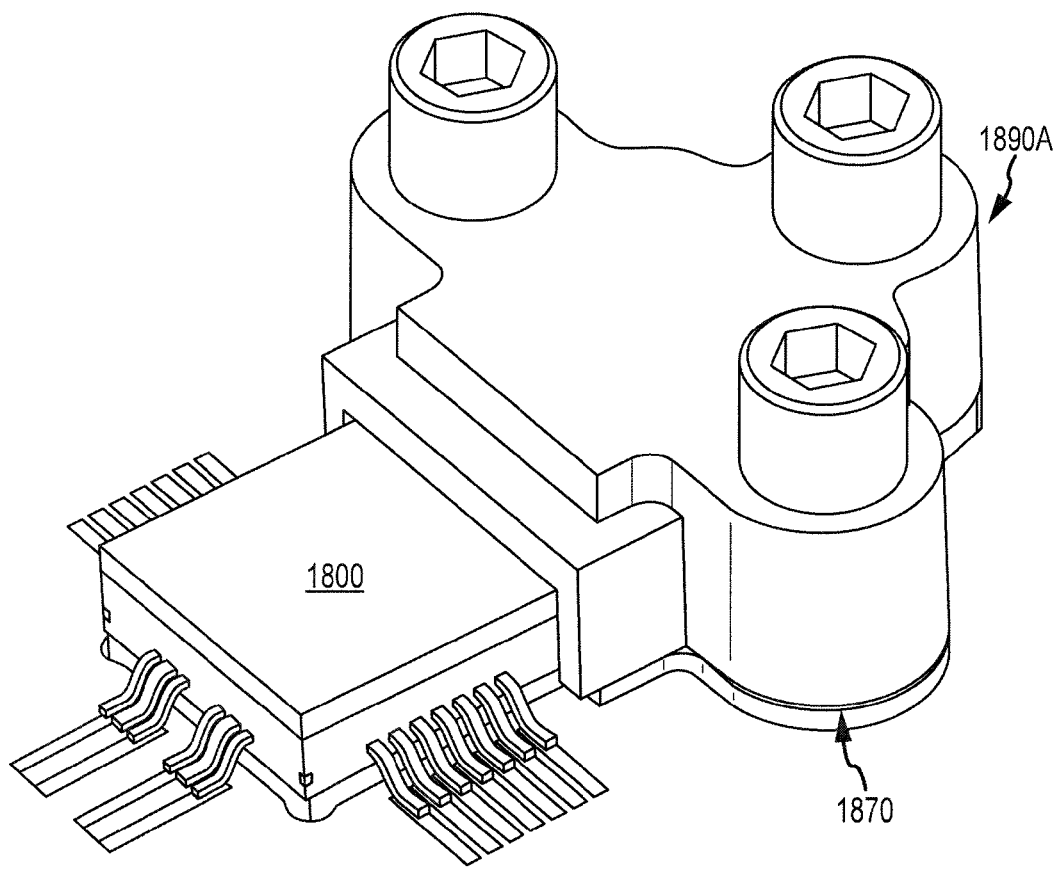
FIGS. 18A-18C illustrate example cover configurations, in accordance with various embodiments.
Figure 18B:
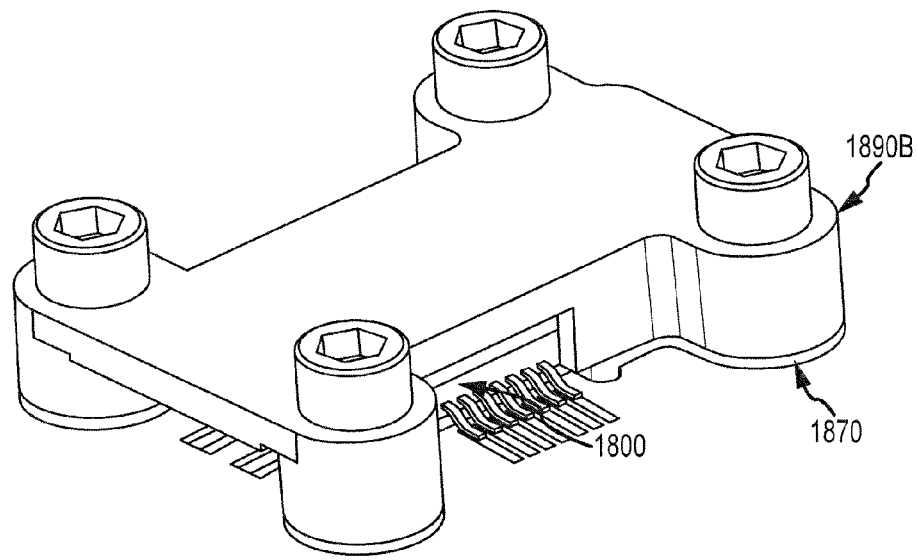
Figure 18C:
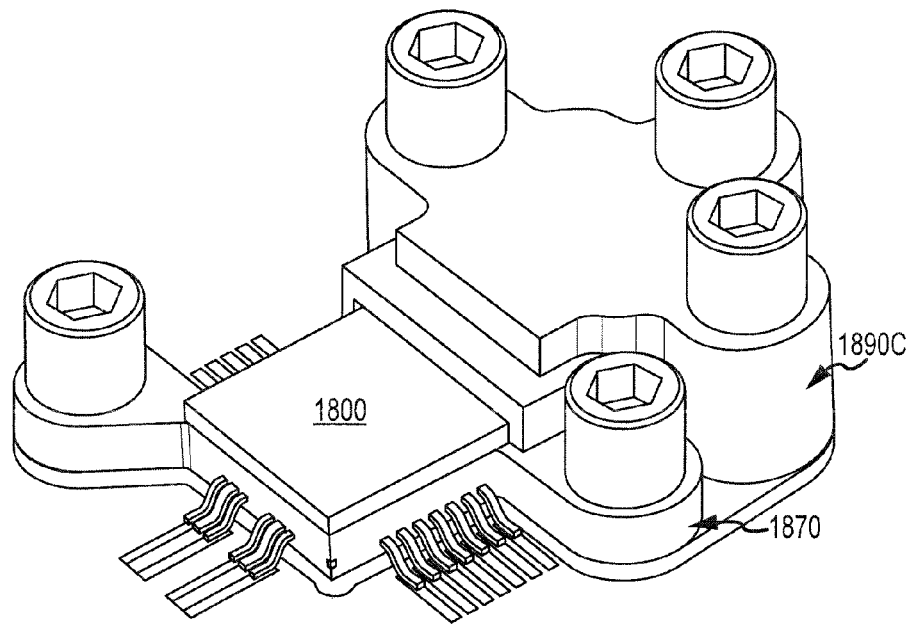

With momentary reference to FIG. 17D, a number of structures each have their own manufacturing tolerances. For example, the height of the pedestal ($L_{pedestal}$), the height of the base leadframe ($L_{base}$), the height of the package from the bottom of the package to the bottom of the leads ($L_{package}$), the height of the spring when not deflected under force ($h_{spring}$), and the height of the PWB ($L_{board}$). The summation of several such manufacturing tolerances can make it difficult to consistently manufacture a combined assembly where good thermal contact is made, without stresses or strains on the MMIC package. As mentioned above, in accordance with various embodiments, the springy leads facilitate taking up the manufacturing tolerances, and/or relieves strain from thermal mismatches.

As mentioned before, the MMIC package may be configured to be in thermal contact with the chassis. This may be accomplished for example via a pedestal that is in thermal contact with both the MMIC package and the chassis. The chassis may serve as the heat sink. In various embodiments, and with reference to FIG. 15, the chassis/housing comprises fins for dissipating heat from the chassis to the environment.

Thus, in various embodiments, a housing comprises: a metal chassis having a waveguide; a PWB attached to the metal chassis; a package comprising an MMIC and a metal portion on a first surface of the package, and a cover separately connected to at least one of the metal chassis and the package. In this embodiment, the MMIC is in direct thermal contact with the metal portion, the package is electrically connected to the PWB, and the metal portion of the package is physically in contact with the metal chassis providing a direct heat sink path from the MMIC to the metal chassis.

Thus, the paddle/base leadframe each serve as a thermal interface between the MMIC and the pedestal/chassis. The raised pedestal in the chassis is configured to mate to the paddle or base leadframe. In various embodiments, thermal grease or epoxy may be used between the pedestal and the paddle or base leadframe.

In various embodiments, the use of a deep downset pad and placing the MMIC or other electronic device on the pad facilitates removing heat efficiently from the MMIC package. Similarly, the use of a base leadframe and placing the MMIC on the base leadframe facilitates removing heat efficiently from the MMIC package. These techniques facilitate thermal enhancement, which is defined to mean improving the rate of heat transfer from the MMIC package when compared to a MMIC package that does not employ the use of such techniques. Furthermore, thermal enhancement may be achieved by any suitable arrangement wherein the MMIC is separated from the chassis by nothing more than leadframe material. Stated another way, in various embodiments, the die in the MMIC package has a direct thermal path through a portion of the leadframe to the exterior of the overmolded package. The die in the MMIC package may also have a direct thermal path through a portion of the leadframe to the chassis.

In various embodiments, the MMIC package comprises a heat sink interface. The heat sink interface is a portion of a leadframe. The heat sink interface may be located on a "bottom side" (i.e., the side closest to the chassis) of the MMIC package. Although, in other example embodiments, the heat sink may be the lid. The heat sink interface may be integrated in the overmolded package. In some example embodiments, the heat sink is flush with a bottom surface of the overmolded package. In other example embodiments, the heat sink interface is recessed within the MMIC package.

At a system level, an example transceiver comprises an overmolded package, a chassis, and a PWB, wherein the overmolded package is in electrical contact with the PWB and wherein an electrical device within the overmolded package is in thermal contact with the chassis. In one example embodiment, the heat sink interface is in direct contact with the chassis when the overmolded package is in contact with the PWB. In various embodiments, the PWB does not interpose between a heat transfer portion of the package and a pedestal portion of the chassis. In other example embodiments, the MMIC package comprises a second leadframe that is a heat sink leadframe, wherein the heat sink leadframe is in direct contact with the chassis. It should be noted that in this discussion, the pedestal is considered to be part of the chassis.

It is noted that in various embodiments, power amplifiers may be high power, high frequency power amplifiers. In some example embodiments, this may mean that the frequency may be greater than 10 GHz and the RF power may be greater that 1 W or the dissipated power may be greater than 5 W. However, the high power, high frequency power amplifiers may comprise other suitable frequencies and power level combinations.

In accordance with another example embodiment, the cover provides a secondary heat sink path for the package.

With reference now to FIGS. 18A-18C, and FIGS. 19A-19C, it is noted that although the launch and the waveguide are now aligned with and in proximity to the waveguide, at this stage in the assembly process the waveguide interface is incomplete. In various embodiments, a cover, e.g., 1890A-1890C, is provided to complete the waveguide interface.

The cover may comprise any suitable material. For example, the cover may be made of metal, metalized plastic, Zn, and/or the like. In various embodiments, the cover is die cast, stamped, machined, etched, and/or the like. Furthermore, any method of manufacturing the cover may be used. The cover may be an electrically conductive cover.

In various embodiments a cover, e.g., 1890A-1890C, is attached to chassis 1870. The cover may be attached using bolts, screws, epoxy, clamps, and/or any suitable attachment method.

Covers 1890A-1890C, respectively, provide a clamping force for securing MMIC package 1800 to the PWB (not shown). Thus, cover 1890A and 1890C cover a small portion of MMIC package 1800 and provide a clamping force. In accordance with another example embodiment, a cover may be placed over a large portion of MMIC package 1800. For example, cover 1890B covers all of MMIC package 1800. It is noted that similar types of covers may be used in connection with single and double leadframe overmolded packages.

In accordance with various embodiments, the overmolded package is mounted to a chassis and the cover is mounted over at least the partial waveguide interface. Furthermore, the cover may be mounted over more or less of the MMIC package. The cover may provide a holding force that retains the overmolded package in fixed position relative to the chassis.

In various embodiments, the cover is a separate component from the overmolded package and also a separate component from the chassis. In one example embodiment, the cover is just the transceiver lid. Furthermore, the cover may additionally form certain shielding walls associated with the package, if desired.

Covers 1890A-1890C each, in various embodiments, comprise a backshort. Each may comprise a partial RF channel leading into the waveguide. In a further example embodiment, cover 1890A-1890C may comprise a step-launch. Furthermore, any suitable transition to waveguide may be used as now known or hereinafter invented.

The cover may be located over part of the integrated partial waveguide interface. Stated another way, the launch may be enclosed between the chassis and the cover. Thus, a wave guide interface comprises, in various embodiments, the cover and the MMIC package (comprising an integrated partial waveguide interface). In various embodiments, a partial interface is a first portion of the waveguide interface and the cover is a second portion of the waveguide interface. In this example embodiment, the first and second portions of the waveguide interface comprise a whole waveguide interface. Moreover, the cover may comprise walls in addition to a top portion.

The cover provides a clamping/bolt down' function for securing the overmolded package relative to the chassis. In the prior art, a package is typically designed so that the bolt down function is part of the package—as opposed to having that function provided by an external component. However, in various embodiments, the overmolded package is clamped between a portion of the cover and the chassis. In accordance with various embodiments, the cover provides a secondary heat transfer path for removing heat from the overmolded package. The cover may be configured to direct RF signals between the launch and the WG.

Thus, in accordance with various embodiments, a transceiver comprises: a surface and a MMIC package, wherein the surface is configured to support the MMIC and transfer heat away from the MMIC, wherein the MMIC package is configured to be surface mounted to the surface, wherein the MMIC package comprises no bolt holes and is not directly bolted to the surface; and a cover, wherein the MMIC package is held in contact with the surface by the cover, wherein the cover is bolted to the surface, and wherein the cover partially covers the MMIC package.

In accordance with another example embodiment, a MMIC package, for surface mounting to the next assembly level, comprises: a leadframe based overmolded package ("overmolded package"), and a die positioned within the overmolded package; wherein the package specifically excludes bolt holes for surface mounting to the next assembly level. In further example embodiments, the MMIC package further comprises a cover that includes bolt holes for surface mounting the cover to the next assembly level and the cover provides a force to hold the MMIC package to the next assembly level.

Figure 19A:
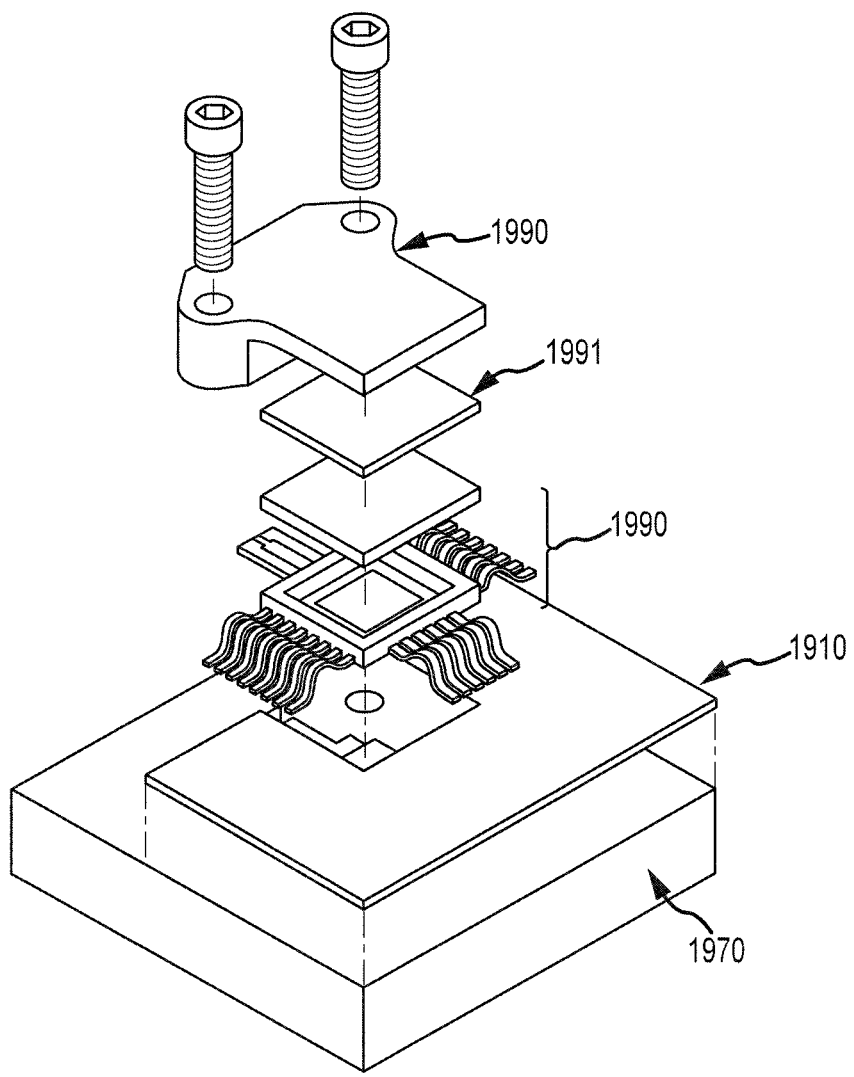
FIGS. 19A-C provide further illustrations of example covers and/or example assemblies comprising example covers, in accordance with various embodiments.
Figure 19B:
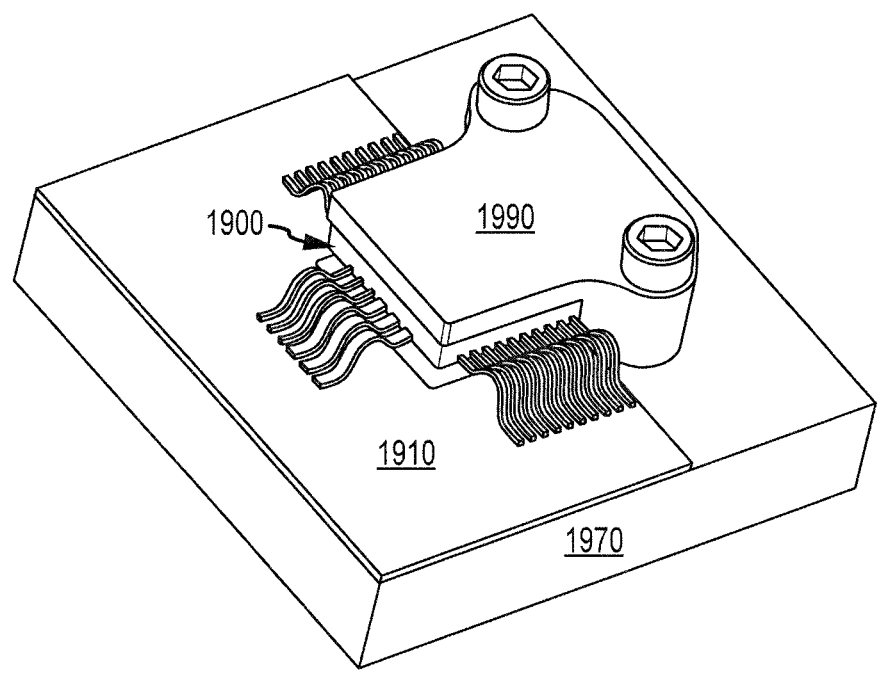
Figure 19C:
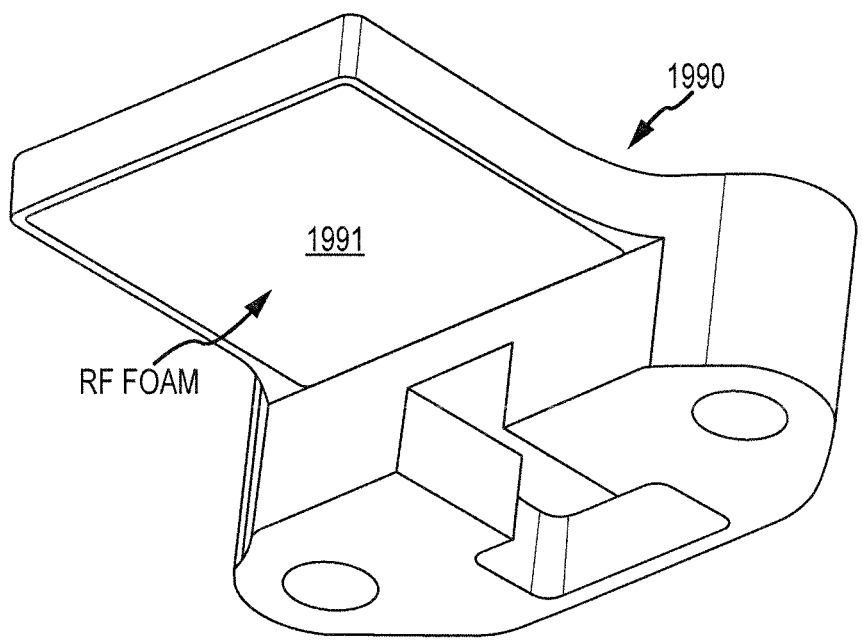

In one example embodiment, and with reference to FIG. 19C, cover 1990 comprises a surface 1991 configured for contact with a MMIC package and for providing a clamping force over the MMIC package. Surface 1991 may further be covered with an RF foam. For example, CRS-124 from Emmerson-Cumming Corporation, or similar materials may be used. The RF foam may facilitate RF isolation of the package. The RF foam may further provide some spring for the protection of the MMIC package from stress and strains.

With reference to FIGS. 19A and 19B, an example exploded view and an example assembled view of a chassis 1970 and PWB 1910 assembly is discussed. In various embodiments, a MMIC package 1900 is connected to PWB 1910 electronically and to chassis 1970 thermally, with a cover 1990. Cover 1990 has a RF absorptive material 1991 connected thereto.

In accordance with another example embodiment, not shown, an overmolded package (MMIC package) is formed as described herein, but without an integrated partial waveguide interface.

Thus, in accordance with various embodiments described herein, a housing comprises: a metal chassis having a waveguide; a package having a portion of an waveguide interface that is integrated in the package, wherein the package is attached directly to the metal chassis aligning a probe portion, of the portion of the waveguide interface, with the waveguide in the metal chassis; and a cover separately connected to at least one of the metal chassis and the package, wherein the cover is one of metal or metalized plastic, and wherein the cover forms a waveguide backshort for the waveguide.

In accordance with another example embodiment, a transceiver device comprises: an MMIC package; and a cover, wherein the cover is a transceiver RF cover, and wherein the transceiver RF cover forms a TX waveguide backshort.

In accordance with another example embodiment, an antenna system comprises a transceiver, and the transceiver comprises: an MMIC package; and a cover, wherein the cover is a transceiver RF cover, and wherein the transceiver RF cover forms a TX waveguide backshort.

Figure 20:
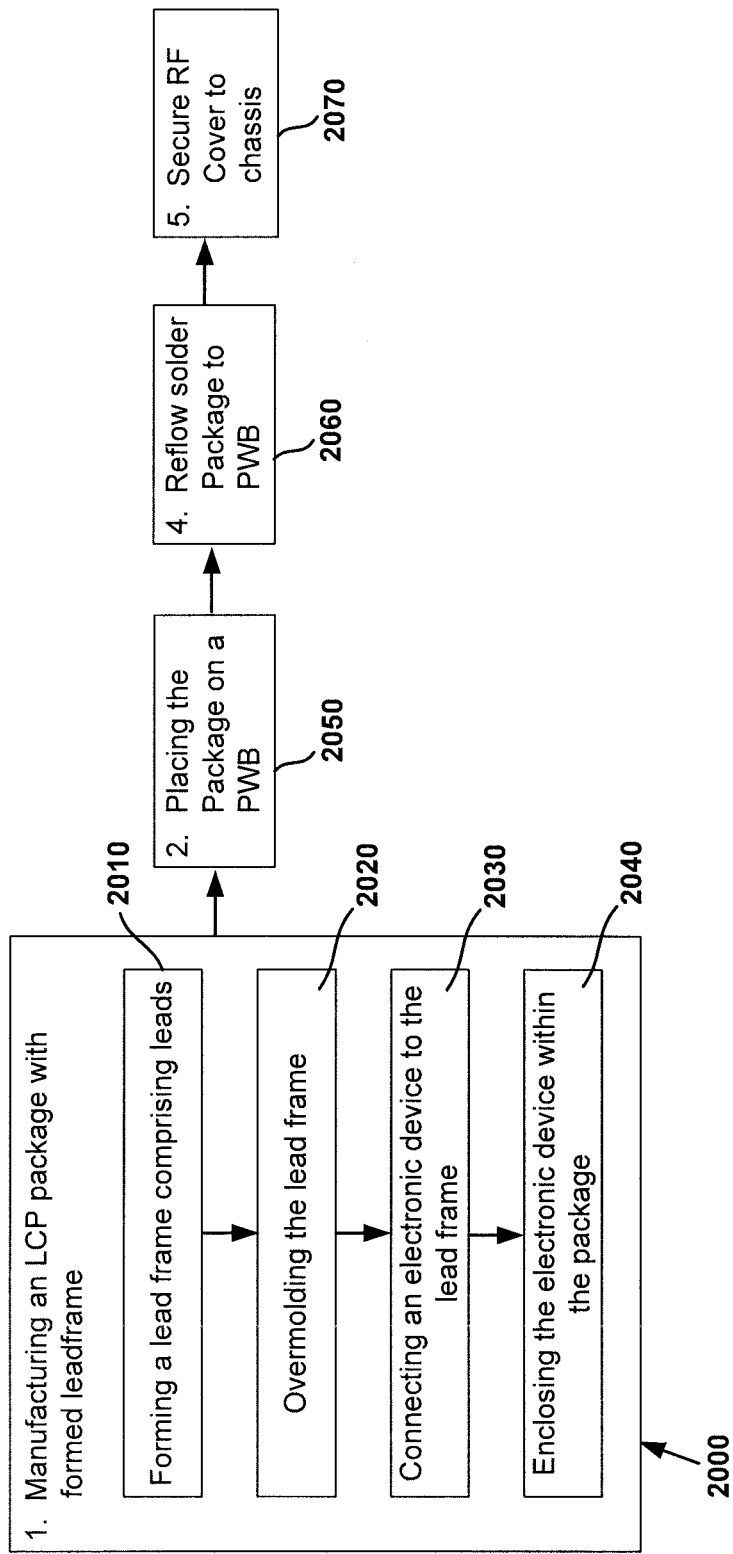
FIG. 20 illustrates various method steps for manufacturing the package, and/or higher level assemblies.

In accordance with various embodiments, and with reference to FIG. 20, a method 2000 of forming a mm-wave MMIC device comprises the steps of: forming a leadframe comprising leads (step 2010); overmolding the leadframe (step 2020); connecting an electronic device to the leadframe within the package body (step 2030); and enclosing the electronic device within the package (step 2040).

In various embodiments, the leads comprise one or more of the following: DC leads, RF leads, a microstrip, and an RF launch. In various embodiments, the leadframe further comprises a pad, and forming a leadframe (step 2010) comprises deep downsetting the pad relative to other portions of the leadframe.

In various embodiments, overmolding the leadframe (step 2020) creates a package body that is integral with the leadframe. In another example embodiment, overmolding the leadframe further includes overmolding at least a portion of the microstrip.

In various embodiments, connecting an electronic device to the leadframe within the package body (step 2030) further comprises wirebonding the electronic device to bond pads of the leadframe. In various embodiments, the electronic device comprises an integrated circuit. Furthermore, in various embodiments, the electronic device comprises an MMIC. In various embodiments, enclosing the electronic device within the package (step 2040) further comprises sealing the electronic device within a cavity by adding a package lid. In various embodiments, the package base and package lid form a package body portion with a protruding integrated partial waveguide interface comprising the microstrip and the RF launch. In another example embodiment, enclosing the electronic device within the package (step 2040) further comprises overmolding the package base to form a package body portion with a protruding integrated partial waveguide interface.

In accordance with an additional example embodiment, a method of manufacturing an RF system further comprises the steps of: placing the package on a PWB (step 2050), reflow soldering the package to the PWB (step 2060), and securing the PWB to a chassis and securing a cover to the chassis (step 2070). In one example embodiment, placing the package is done using "pick and place" technology. In another example embodiment, placing the package is done by surface mounting the package to the PWB.

In accordance with another example embodiment, the PWB is attached to a chassis, and a cover is secured to the chassis. In this example embodiment, the chassis comprises a waveguide, and the package is surface mounted with the RF launch aligned with the waveguide. In various embodiments, the attached cover forms a backstop for the waveguide.

In various embodiments, the integrated partial waveguide interface is completed to form a complete waveguide interface only after the overmolded package is completely assembled. In various embodiments, the integrated partial waveguide interface is completed to form a complete waveguide interface only after the overmolded package is completely assembled and attached to a chassis. In other example embodiments, the integrated partial waveguide interface is completed to form a complete waveguide interface only after the overmolded package is completely assembled, attached to a chassis, and a cover is attached. In yet other example embodiments, the integrated partial waveguide interface is completed by attaching a cover to a chassis with a launch of the integrated partial waveguide interface located between the cover and the chassis. The chassis may, for example, be part of a transceiver system.

Thus, in various embodiments, an MMIC package may be formed in a cost effective manner. The MMIC package may be made relatively inexpensively (for example) through use of injection molding. Mass production is facilitated, and at the MMIC package level, no PWB is used.

Moreover, the use of the MMIC package facilitates reliability, and manufacturing efficiency. The MMIC package can be installed using a pick and place technology. The package can be surface mounted, and/or reflow soldered. This is in contrast to hand soldering MMICs directly to the PWB. In this manner, rework may be reduced. Furthermore, these methods facilitate production of low cost/high volume packages. Moreover, heat dissipation is improved as compared to heat dissipation where the MMIC is directly attached to the PWB. For example, heat dissipation may be over 20 watts over a small area (such as for example, 1 to 5 square mm, although other small area sizes may be used).

Use of the MMIC package gives rise to an issue regarding stacking tolerances. This issue is important in that the MMIC package/PWB/chassis interaction can give rise to stresses and fractures if not accounted for. These tolerance issues are inexpensively addressed using spring like leads.

In the prior art, it was not obvious to make a MMIC package and/or integrated waveguide MMIC package out of plastic overmold material. An all plastic encapsulated component would likely experience thermal transfer problems. Moreover, if the waveguide interface were entirely made of plastic, there might be problems with RF shielding and forming the waveguide backshort. But the construction techniques described herein facilitate a plastic MMIC package with desirable thermal transfer characteristics. And the integrated partial waveguide interface facilitates forming a plastic MMIC package without the RF shielding and backshort issues.

In various embodiments, the Intermediate Frequency signal could be in the range of 0 to 10 GHz and the Local Oscillator and RF signals may be in the 10 to 100 GHz frequency ranges. Although any suitable frequency ranges may be used.

It should be noted that the term surface mounting is used herein in a slightly different convention. However, it is still the case that the components discussed herein as being surface mounted can, in various embodiments, be installed using standard surface mount manufacturing equipment and techniques. Thus, they are described as surface mounted even though the mounting may be relative to two or more surfaces (e.g., the pedestal and the PWB).

STATEMENTS OF INVENTION

In an example embodiment, a semiconductor device comprises: a molded MMIC package including a MMIC; and a partial waveguide interface molded into the molded MMIC package. In one example embodiment, the molded MMIC package and the partial waveguide interface are formed using a leadframe that is injection overmolded, and wherein the injection overmolding is performed with a liquid crystal polymer material. In an exemplary embodiment, an antenna system comprises a transceiver, and the transceiver comprises such a semiconductor device; and further comprises a cover, wherein the cover is a transceiver RF cover, and wherein the transceiver RF cover forms a transmit waveguide backshort, and wherein the combination of the cover and the partial waveguide interface comprises a complete waveguide interface.

In an example embodiment, a radio frequency ("RF") MMIC package comprises: a package body portion comprising a MMIC disposed within the package body portion; a partial waveguide interface; an overmold material forming portions of both the package body portion and the partial waveguide interface so as to cause the partial waveguide interface to be an integral part of the package body portion; and a leadframe, wherein the leadframe is electrically connected to the MMIC, and wherein the leadframe forms part of both the package body portion and the waveguide interface.

In one example embodiment, the package body portion further comprises: a package base; and a package lid connected to the package base to form the package body portion, wherein the package lid is connected to the package base such that the MMIC is hermetically enclosed within a cavity inside the RF MMIC package. In one example embodiment, the overmold material is a liquid crystal polymer ("LOP"). In one example embodiment, the package lid is formed of at least one of the following materials: injection molded plastic, ceramic, stamped plastic or metal; and wherein the materials are one of metal plated and not metal plated. In one example embodiment, a radio frequency absorbing material is provided on a first surface of the package lid, wherein the first surface of the package lid faces the die. In one example embodiment, the radio frequency absorbing material comprises ecosorb. In one example embodiment, the package body portion is a fully encapsulated overmolded package.

In one example embodiment, the RF MMIC package comprises more than one integrated partial waveguide interfaces. In one example embodiment, the integrated partial waveguide interface is a first integrated partial waveguide interface, and wherein the RF MMIC package comprises both the first integrated partial waveguide interface and a second integrated partial waveguide interface. In one example embodiment, at least one of the following: the first integrated partial waveguide interface is an input interface, and the second integrated partial waveguide interface is an output interface; the first and second integrated partial waveguide interfaces are each an input interface; and the first and second integrated partial waveguide interfaces are each an output interface. In one example embodiment, at least one of the following: the first integrated partial waveguide interface is an input interface, and the second integrated partial waveguide interface and a third integrated partial waveguide interface are output interfaces; the first and second integrated partial waveguide interfaces are each an input interface, and the third integrated partial waveguide interface is an output interface. In one example embodiment, the integrated partial waveguide interface is at least partially supported, at least on one side, by an overmold material integral with the overmold material of the package body portion. In one example embodiment, the integrated partial waveguide interface comprises a signal conducting structure, supporting material, and a launch. In one example embodiment, the supporting material is the same overmold material used in the rest of the MMIC package, and wherein the supporting material is in contact with at least a portion of the signal conducting structure.

In one example embodiment, the MMIC package is at least partially formed by one of: injection molding with an overmold material; and molding or casting, with an overmold material. In one example embodiment, the overmold material comprises one of: any dielectric moldable material; a ceramic; and a polymer. In one example embodiment, the polymer comprises one of the following polymers: liquid crystal polymer (LCP), Polyphenylene Sulfide (PPS), Polyether ether ketone (PEEK), any thermoplastic polymer, and any thermoset polymer. In one example embodiment, the MMIC package is at least partially formed by molding or casting, with an overmold material, and further comprising a slot in the overmold material configured for securely holding a portion of a leadframe. In one example embodiment, the die comprises a MMIC. In one example embodiment, the MMIC comprises a high power amplifier.

In one example embodiment, the MMIC package further comprises at least on RF interface and at least one direct current ("DC") interface, and wherein the DC interface is electrically connected to a printed wiring board ("PWB"). In one example embodiment, the MMIC package further comprises a lead structure formed from a leadframe that is at least partially enclosed in an overmold material, wherein the lead structure forms the at least one DC interface. In one example embodiment, the leadframe comprises one of: copper, copper alloy, other metals. In one example embodiment, the MMIC is attached via wirebonds to the DC interface inside the package. In one example embodiment, the at least one DC interface comprises spring leads that are configured to compensate for mechanical stresses and tolerances. In one example embodiment, the at least one RF and DC interfaces each comprise spring leads. In one example embodiment, leads are shaped to provide controlled characteristic impedance. In one example embodiment, the MMIC package further comprises at least one radio frequency ("RF") interface, and wherein the RF interface is electrically connected to a printed wiring board ("PWB"), and further comprising a lead structure formed from a leadframe that is at least partially enclosed in an overmold material, wherein the lead structure forms the at least one RF interface; wherein the MMIC is attached to the RF interfaces inside the package via wirebonds; and wherein the at least one RF interface comprises spring leads that are configured to compensate for mechanical stresses and tolerances.

In one example embodiment, the MMIC package further comprises an external electrically conductive cover ("cover"), and a waveguide interface, wherein the partial waveguide interface is a first portion of the waveguide interface and the cover is a second portion of the waveguide interface. In one example embodiment, the MMIC package further comprises an electrically conductive cover ("cover"), wherein the partial waveguide interface comprises a first portion of a waveguide interface, wherein the cover comprises a second portion of the waveguide interface, and wherein the first and second portions of the waveguide interface comprise a whole waveguide interface. In one example embodiment, the RF MMIC package is mounted to a chassis and the cover is mounted over at least the partial waveguide interface. In one example embodiment, the cover forms a waveguide backshort. In one example embodiment, the cover provides a holding force that retains the RF MMIC package in fixed position relative to the chassis. In one example embodiment, the cover is a separate component from the RF MMIC package. In one example embodiment, the cover is made of metal or is metalized. In one example embodiment, cover provides a clamping/bolt down' function for securing the RF MMIC package relative to the chassis. In one example embodiment, a transceiver comprises the MMIC package, wherein the RF MMIC package is mounted to a chassis, and wherein the transceiver further comprises a cover comprising a backshort, wherein the back short is located over at least part of the integrated partial waveguide interface, and wherein the RF MMIC package is clamped between a portion of the cover and the chassis. In one example embodiment, the cover is attached via screws or bolts. In one example embodiment, a transceiver device comprises the RF MMIC package, and a transceiver RF cover, wherein the transceiver RF cover forms a transmit waveguide backshort.

An example method of forming a mm-wave MMIC package comprises the steps of: forming a leadframe comprising leads, wherein the leads include DC leads, RF leads, a waveguide transition, and an RF launch; overmolding at least a portion of the waveguide transition and portions of the leadframe, wherein the overmolding creates a package base that is integrated with a partial waveguide interface, wherein the partial waveguide interface protrudes from the package base, wherein the integrated partial waveguide interface comprises the waveguide transition and the RF launch; and attaching and electrically connecting a MMIC to the leadframe within the package base.

In one example embodiment, the method further comprises adding a package lid and sealing the MMIC within a cavity formed between the package lid and the package base, wherein the combination of the package lid and the package base form a package body portion. In one example embodiment, electrically connecting comprises wire bonding, and wherein attaching comprises using epoxy to attach. One example embodiment further comprises the steps of: surface mounting the mm-wave MMIC package to a chassis, wherein the chassis comprises a waveguide, wherein the package is surface mounted with the RF launch aligned with the waveguide; and attaching a cover that forms a backshort for the waveguide. In one example embodiment, the integrated partial waveguide interface is completed to form a complete waveguide interface when the MMIC package is completely assembled, attached to a chassis, and a cover is attached. In one example embodiment, the integrated partial waveguide interface is completed by attaching a cover to a chassis with a launch of the integrated partial waveguide interface located between the cover and the chassis.

In an example embodiment, a high power, overmolded MMIC device is disclosed, with one or more integrated partial waveguide interfaces, wherein high power is defined as thermal dissipation from the MMIC of greater than one of: 5 watts, 8 watts, or 10 watts, wherein the MMIC is a high frequency MMIC, wherein high frequency is defined as a frequency of 8 GHz or higher. In one example embodiment, the MMIC device is one of a power amplifier and a block up converter. In one example embodiment, the one or more integrated partial waveguide interfaces are each one of: an input interface and an output interface; two input interfaces; and two output interfaces.

In an example embodiment, a mm-wave MMIC device comprises: an overmolded leadframe package; and an integrated partial wave guide interface that is configured to work in conjunction with a separate waveguide backshort.

In an example embodiment, a MMIC package comprises: a leadframe based overmolded package ("overmolded package"), a die positioned within the overmolded package; and a partial waveguide interface, wherein the partial waveguide interface is integral with the overmolded package. In one example embodiment, the overmolded package does not comprise a printed wiring board.

In an example embodiment, a mm-wave MMIC device comprises: an overmolded leadframe package; and an integrated wave guide interface that does not include an integrated waveguide backshort. In an example embodiment, a partial waveguide interface is integrated with a package, wherein the package comprises a MMIC, an exposed heat sink, and leads. In an example embodiment, a high power amplifier comprises: a MMIC; a package with an exposed heat sink; and leads, wherein the leads are overmolded in the package.

In an example embodiment, a transceiver comprises: a chassis; a surface associated with the chassis; a MMIC package supported by the surface, wherein the surface is configured to transfer heat away from the MMIC and conduct the heat directly to the chassis of a next higher level assembly, wherein the MMIC package is configured to be in contact with the surface; and a cover, wherein the MMIC package is held in contact with the surface by the cover, wherein the cover is bolted to the surface, wherein the cover partially covers the MMIC package. In one example embodiment, the MMIC package comprises no bolt holes and is not directly bolted to the surface.

In an example embodiment, a housing comprises: a metal chassis having a waveguide; a printed wiring board ("PWB") attached to the metal chassis; a package comprising a MMIC and a metal portion on a first surface of the package, the MMIC in direct thermal contact with the metal portion; the package electrically connected to the PWB, and wherein the metal portion of the package is attached directly to the metal chassis providing a direct heat sink path from the MMIC to the metal chassis; wherein the package comprises a portion of an waveguide interface that is integrated in the package, wherein the package is located so as to align a probe portion of the waveguide interface with the waveguide in the metal chassis; and a cover separately connected to the metal chassis, wherein the cover is one of a metal cover or a metalized plastic cover, and wherein the cover forms a waveguide backshort for the waveguide. In one example embodiment, the cover is also in contact with the package, and provides a holding force to keep the package in contact with the chassis. In one example embodiment, the cover provides a secondary heat sink path for the package.

In an example embodiment, a radio frequency ("RF") MMIC package comprises: a package body portion comprising a MMIC disposed within the package body portion; a partial waveguide interface; an over-mold material, wherein the overmold material is injection molded in connection with both the package body portion and the partial waveguide interface so as to cause the partial waveguide interface to be an integral part of the package body portion; and a leadframe, wherein the leadframe is electrically connected to the MMIC, and wherein the leadframe forms part of both the package body portion and the waveguide interface, wherein the package body portion further comprises: a package base; and a package lid connected to the package base to form the package body portion, wherein the package lid is connected to the package base such that the MMIC is hermetically enclosed within a cavity inside the RF MMIC package.

In one example embodiment, the package includes a bottom side heat sink interface. In one example embodiment, the system further comprises: a chassis and a printed wiring board ("PWB"), wherein the PWB does not interpose between a heat transfer portion of the package and a metal portion of the chassis. In one example embodiment, the die has a direct thermal path through a portion of the leadframe to the bottom of the overmolded package. In one example embodiment, the system further comprises: a chassis and a printed wiring board ("PWB"), wherein the overmolded package is in electrical contact with the PWB and wherein the die is in direct thermal contact with the chassis. In one example embodiment, the system further comprises: a chassis and a printed wiring board ("PWB"), wherein the overmolded package comprises a heat sink integrated in the overmolded package, wherein the heat sink is flush with a bottom surface of the overmolded package, wherein the heat sink is in direct contact with the chassis when the overmolded package is in contact with the PWB and the chassis. In one example embodiment, the system further comprises a second leadframe that is a heat sink leadframe, wherein the heat sink leadframe is configured to transfer heat through an attached chassis, wherein the second leadframe is in contact with the MMIC. In one example embodiment, the system further comprises a leadframe in the overmolded package, wherein at least a portion of the leadframe is deep downset. In one example embodiment, deep downset means that a portion of the leadframe forms a first surface that is positioned within the overmolded package such that a metal surface of a higher assembly level is in contact with the first surface of the overmolded package. In one example embodiment, the leadframe is deep downset such that heat may be transferred from the die through the metal surface to an attached chassis. In one example embodiment, the MMIC is a high power MMIC, wherein high power is defined as thermal dissipation from the MMIC of greater than one of: 5 watts, 8 watts, or 10 watts, wherein the MMIC is a high frequency MMIC, and wherein high frequency is defined as a frequency of 8 GHz or higher. In one example embodiment, the system further comprises an electrically conductive cover ("cover"), wherein the partial waveguide interface comprises a first portion of a waveguide interface, wherein the cover comprises a second portion of the waveguide interface, and wherein the first and second portions of the waveguide interface comprise a whole waveguide interface, wherein the overmolded package is mounted to a chassis and the cover is mounted over at least the partial waveguide interface, and wherein the cover provides a secondary heat transfer path for removing heat from the overmolded package.

A method of forming a mm-wave MMIC package comprises the steps of: forming a leadframe comprising leads, wherein the leads include DC leads, RF leads, a waveguide transition, and an RF launch; overmolding at least a portion of the waveguide transition and portions of the leadframe, wherein the overmolding creates a package base that is integrated with a partial waveguide interface, wherein the partial waveguide interface protrudes from the package base, wherein the integrated partial waveguide interface comprises the waveguide transition and the RF launch; and attaching and electrically connecting a MMIC to the leadframe within the package base; wherein the step of forming a leadframe further comprises deep downsetting the leadframe relative to other portions of the leadframe.

An example method of forming a mm-wave MMIC package comprises the steps of: forming a leadframe comprising leads, wherein the leads include DC leads, RF leads, a waveguide transition, and an RF launch; overmolding at least a portion of the waveguide transition and portions of the leadframe, wherein the overmolding creates a package base that is integrated with a partial waveguide interface, wherein the partial waveguide interface protrudes from the package base, wherein the integrated partial waveguide interface comprises the waveguide transition and the RF launch; and attaching and electrically connecting a MMIC to the leadframe within the package base; wherein the integrated partial waveguide interface is completed to form a complete waveguide interface when the MMIC package is completely assembled and attached to a chassis, and wherein the MMIC package comprises a heat sink integrated in the MMIC package, wherein the heat sink is flush with a bottom surface of the MMIC package, wherein the heat sink is in direct contact with the chassis when the MMIC package is in contact with a printed wiring board ("PWB") and the chassis.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. Furthermore, couple may mean that two objects are in communication with each other, and/or communicate with each other, such as two pieces of hardware. Furthermore, the term "and/or" may mean "and," it may mean "or," it may mean "exclusive-or," it may mean "one," it may mean "some, but not all," it may mean "neither," and/or it may mean "both," although the scope of claimed subject matter is not limited in this respect.

It should be appreciated that the particular implementations shown and described herein are illustrative of various embodiments including its best mode, and are not intended to limit the scope of the present disclosure in any way. For the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical communication system.

While the principles of the disclosure have been shown in embodiments, many modifications of structure, arrangements, proportions, the elements, materials and components, used in practice, which are particularly adapted for a specific environment and operating requirements without departing from the principles and scope of this disclosure. These and other changes or modifications are intended to be included within the scope of the present disclosure and may be expressed in the following claims.

We claim:

1. A semiconductor device comprising:
   a molded Monolithic Microwave Integrated Circuit ("MMIC") package including a MMIC, wherein the molded MMIC package further comprises a heat sink interface in thermal contact with the MMIC for transferring heat away from the MMIC through the heat sink interface, wherein the heat sink interface is integrated in the molded MMIC package; and
   a waveguide launch molded into the molded MMIC package.

2. The semiconductor device of claim 1, wherein the heat sink interface is a bottom side heat sink interface, and wherein either the heat sink interface is flush with a bottom surface of the molded MMIC package, or the heat sink interface is recessed from the bottom surface within the molded MMIC package, wherein the bottom surface is a surface closest to a surface mounting side of the molded MMIC package.

3. The semiconductor device of claim 1, wherein the heat sink interface is a portion of a leadframe.

4. The semiconductor device of claim 1, the molded MMIC package further comprising:
   a leadframe, wherein the leadframe is injection overmolded with an overmold material to form a package body portion, wherein the MMIC is electrically connected to at least a first portion of the leadframe, wherein the MMIC is disposed within the package body portion, and wherein the heat sink interface is a second portion of the leadframe; and
   a package lid connected to the package body portion, the package lid connected to the package body portion to hermetically enclose the MMIC within an air cavity inside the molded MMIC package.

5. The semiconductor device of claim 4, wherein the MMIC has a direct thermal path through the second portion of the leadframe to a bottom side of the molded MMIC package.

6. The semiconductor device of claim 4, wherein the second portion of the leadframe is a heat sink leadframe for transferring heat from the MMIC to an attached chassis through the heat sink leadframe.

7. The semiconductor device of claim 4, wherein at least the second portion of the leadframe is deep downset relative to the first portion of the leadframe.

8. The semiconductor device of claim 4, wherein at least the second portion of the leadframe is deep downset forming a first surface that is positioned within the molded MMIC package such that a metal surface of a higher assembly level is in contact with the first surface of the molded MMIC package.

9. The semiconductor device of claim 4, wherein the second portion of the leadframe is deep downset for transferring heat from the MMIC through the metal surface to an attached chassis.

10. A transceiver comprising:
    a chassis, wherein the chassis comprises a waveguide;
    a molded monolithic microwave integrated circuit (MMIC) package comprising:
    a MMIC;
    a launch molded into the molded MMIC package; and
    a heat sink interface, wherein the molded MMIC package is mounted to the chassis, and wherein the heat sink interface is in thermal contact with the MMIC and the chassis for transferring heat away from the MMIC through the heat sink interface to the chassis; and
    a cover, wherein the cover is an RF cover, and wherein the RF cover forms a waveguide backshort, and wherein the cover is mounted in contact with the chassis and the molded MMIC package.

11. The transceiver of claim 10, further comprising:
    a printed wiring board ("PWB"), wherein the molded MMIC package is electrically connected to the PWB, and wherein the PWB does not interpose between a heat transfer portion of the molded MMIC package and a metal portion of the chassis.

12. The transceiver of claim 10, further comprising:
    a printed wiring board ("PWB"), wherein the molded MMIC package is in electrical contact with the PWB and wherein the MMIC is in direct thermal contact with the chassis.

13. The transceiver of claim 10, further comprising:
    a printed wiring board ("PWB"), wherein the heat sink interface is integrated in the molded MMIC package, wherein the heat sink interface is flush with a bottom surface of the molded MMIC package, wherein the heat sink interface is in direct contact with the chassis when the molded MMIC package is in contact with the PWB and the chassis.

14. A transceiver device comprising:
    a molded monolithic microwave integrated circuit (MMIC) package having a launch for communicating RF signals external to the molded MMIC package;
    a MMIC located within the molded MMIC package;
    a cover;
    a housing having a metal chassis, wherein the metal chassis comprises a waveguide;
    wherein the molded MMIC package is in thermal contact with the metal chassis for transferring heat from the MMIC to the metal chassis, wherein with the launch is in proximity to the waveguide in the metal chassis;
    wherein the cover is a separate component from the molded MMIC package, wherein the cover is separately connected to at least one of the metal chassis and the molded MMIC package, wherein the cover is one of metal or metalized plastic, and wherein the cover forms a transmit waveguide backshort for the waveguide; and
    a printed wiring board ("PWB") attached to the metal chassis.

15. The transceiver device of claim 14, wherein the PWB does not interpose between a heat transfer portion of the molded MMIC package and a metal portion of the metal chassis.

16. The transceiver device of claim 14, wherein the molded MMIC package comprises a heat sink interface integrated in the molded MMIC package, wherein the heat sink interface is flush with a bottom surface of the molded MMIC package, wherein the heat sink interface is in direct contact with the metal chassis when the molded MMIC package is in contact with the PWB and the metal chassis.

17. The transceiver device of claim 14, wherein the molded MMIC package comprises a metal portion on a first surface of the molded MMIC package, wherein the MMIC is in direct thermal contact with the metal portion, the molded MMIC package is electrically connected to the PWB, and the metal portion of the molded MMIC package is physically in contact with the metal chassis providing a direct heat sink path from the MMIC to the metal chassis.

18. The transceiver device of claim 14, wherein the molded MMIC package comprises a leadframe that is integrated in the molded MMIC package, wherein the MMIC in the molded MMIC package has a direct thermal path through a portion of the leadframe to the metal chassis.

19. The transceiver device of claim 14, wherein the metal chassis further comprises:
 a pedestal that is in thermal contact with the molded MMIC package.

20. The transceiver device of claim 19, wherein the molded MMIC package further comprises a base leadframe providing a thermal interface between the MMIC and the pedestal, wherein the MMIC is directly touching the base leadframe.

\* \* \* \* \*